US012288762B2

(12) United States Patent
Ma

(10) Patent No.: US 12,288,762 B2
(45) Date of Patent: Apr. 29, 2025

(54) SEMICONDUCTOR CHIP WITH SIGNAL BUMP AND DUMMY BUMP, SEMICONDUCTOR PACKAGE INCLUDING THE SEMICONDUCTOR CHIP AND METHOD FOR MANUFACTURING THE SEMICONDUCTOR PACKAGE

(71) Applicant: Samsung Electronics Co., Ltd., Suwon-si (KR)

(72) Inventor: Keum Hee Ma, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 508 days.

(21) Appl. No.: 17/711,362

(22) Filed: Apr. 1, 2022

(65) Prior Publication Data

US 2022/0392859 A1    Dec. 8, 2022

(30) Foreign Application Priority Data

Jun. 8, 2021 (KR) .......................... 10-2021-0074206

(51) Int. Cl.
| | |
|---|---|
| H01L 23/00 | (2006.01) |
| H01L 23/16 | (2006.01) |
| H01L 25/00 | (2006.01) |
| H01L 25/065 | (2023.01) |
| H01L 25/18 | (2023.01) |

(52) U.S. Cl.
CPC .............. *H01L 24/06* (2013.01); *H01L 23/16* (2013.01); *H01L 23/562* (2013.01); *H01L 25/0652* (2013.01); *H01L 25/18* (2013.01); *H01L 25/50* (2013.01); *H01L 2224/14519* (2013.01); *H01L 2225/06513* (2013.01); *H01L 2225/06541* (2013.01); *H01L 2225/06586* (2013.01); *H01L 2225/06589* (2013.01)

(58) Field of Classification Search
CPC ....................................................... H01L 24/06
USPC ........................................................ 257/737
See application file for complete search history.

(56) References Cited

U.S. PATENT DOCUMENTS

| | | | |
|---|---|---|---|
| 9,899,296 B2 | 2/2018 | Chou et al. | |
| 10,134,702 B2 | 11/2018 | Seo et al. | |
| 10,388,622 B2 | 8/2019 | Chang et al. | |
| 10,559,547 B2 | 2/2020 | Shibata et al. | |
| 2013/0159950 A1* | 6/2013 | Lin ...................... | G06F 30/392 |
| | | | 716/113 |
| 2017/0162545 A1 | 6/2017 | Park et al. | |

(Continued)

FOREIGN PATENT DOCUMENTS

JP        2016157844 A    9/2016

*Primary Examiner* — Ajay Arora
(74) *Attorney, Agent, or Firm* — Myers Bigel, P.A.

(57) ABSTRACT

A semiconductor device includes a semiconductor element layer including a semiconductor substrate including a bump area and a dummy bump area. A TSV structure is in the bump area and vertically extends through the semiconductor substrate, a first topmost line is in the bump area and on the TSV structure and electrically connected to the TSV structure, a signal bump is in the bump area and has a first width in a first direction and is electrically connected to the TSV structure via the first topmost line, a second topmost line is in the dummy bump area and has the same vertical level as a vertical level of the first topmost line and extends in the first direction, and a dummy bump is in the dummy bump area and contacts the second topmost line and has a second width in the first direction larger than the first width.

20 Claims, 26 Drawing Sheets

(56) References Cited

U.S. PATENT DOCUMENTS

2020/0395325 A1  12/2020  Mohammed et al.
2024/0213219 A1* 6/2024  Bang ................. H01L 23/49827

* cited by examiner

SEMICONDUCTOR CHIP WITH SIGNAL BUMP AND DUMMY BUMP, SEMICONDUCTOR PACKAGE INCLUDING THE SEMICONDUCTOR CHIP AND METHOD FOR MANUFACTURING THE SEMICONDUCTOR PACKAGE

CROSS-REFERENCE TO RELATED APPLICATION

This application claims priority under 35 U.S.C. 119 from Korean Patent Application No. 10-2021-0074206, filed on Jun. 8, 2021 in the Korean Intellectual Property Office, the contents of which are incorporated by reference in their entirety.

FIELD

The present disclosure relates to a semiconductor chip, a semiconductor package including the semiconductor chip, and a method for manufacturing the semiconductor package.

BACKGROUND

An electronic device is becoming smaller and lighter in accordance with rapid development of the electronic industry and user demand. Thus, a semiconductor package used in the electronic device is required to have high performance and large capacity along with the miniaturization and weight reduction. In order to realize the high performance and large capacity as well as the miniaturization and weight reduction, research and development of a semiconductor chip including a Through Silicon Via (TSV) structure and a semiconductor package including the semiconductor chip are continuously being conducted.

Accordingly, high-rise building of a semiconductor chip stack structure, reduction in a bump diameter, and reduction in a TSV diameter may be required. Accordingly, an effect of improving thermal characteristics is essential.

SUMMARY

A technical purpose of the present disclosure is to provide a semiconductor chip including a dummy bump relatively wider than a signal bump and thus having improved thermal characteristics.

A technical purpose of the present disclosure is to provide a semiconductor chip in which a topmost line contacts a dummy bump, thereby improving thermal characteristics thereof.

A technical purpose of the present disclosure is to provide a semiconductor package including a semiconductor chip including a dummy bump relatively wider than a signal bump and thus having improved thermal characteristics.

A technical purpose of the present disclosure is to provide a semiconductor package including a semiconductor chip in which a topmost line contacts a dummy bump, thereby improving thermal characteristics thereof.

Purposes according to the present disclosure are not limited to the above-mentioned purpose. Other purposes and advantages according to the present disclosure that are not mentioned may be understood based on the following description, and may be more clearly understood based on embodiments according to the present disclosure. Further, it will be understood that the purposes and advantages according to the present disclosure may be realized using arrangements described and shown in the claims, specification, drawings, and combinations thereof.

According to an aspect of the present disclosure, there is provided a semiconductor device including a semiconductor element layer including a semiconductor substrate including a bump area and a dummy bump area non-overlapping each other horizontally, wherein a through silicon via (TSV) structure is disposed in the bump area and vertically extends through the semiconductor substrate, a first topmost line disposed in the bump area and on the TSV structure, and electrically connected to the TSV structure, a signal bump disposed in the bump area, and having a first width in a first direction, and electrically connected to the TSV structure via the first topmost line, a second topmost line disposed in the dummy bump area, and having a vertical level that is the same as a vertical level of the first topmost line, and extending in the first direction and a dummy bump disposed in the dummy bump area, and contacting the second topmost line, and having a second width in the first direction larger than the first width.

According to an aspect of the present disclosure, there is provided a semiconductor package including a package substrate and first and second semiconductor chips sequentially stacked on the package substrate, wherein the first semiconductor chip includes a first semiconductor element layer including a first semiconductor substrate including a first bump area and a first dummy bump area that do not overlap one another horizontally, wherein a first TSV structure is disposed in the first bump area and vertically extends through the first semiconductor substrate, wherein the first bump area is electrically connected to a second bump area of the second semiconductor chip via the first TSV structure, wherein the first dummy bump area is vertically aligned with or vertically overlaps a second dummy bump area of the second semiconductor chip, a first topmost line disposed in the first bump area and on the first TSV structure and electrically connected to the first TSV structure, a signal bump disposed in the first bump area, and having a first width in a first direction and electrically connected to the first TSV structure via the first topmost line, a second topmost line disposed in the first dummy bump area, and having a vertical level that is the same as a vertical level of the first topmost line, and extending in the first direction; and a dummy bump disposed in the first dummy bump area, and contacting the second topmost line, and having a second width in the first direction larger than the first width.

According to an aspect of the present disclosure, there is provided a method for manufacturing a semiconductor package, the method including providing a semiconductor substrate including a bump area and a dummy bump area that do not overlap horizontally, wherein a TSV structure is disposed in the bump area and vertically extends through the semiconductor substrate, forming a first topmost line in the bump area and on the TSV structure such that the first topmost line is electrically connected to the TSV structure, forming a second topmost line in the dummy bump area such that the second topmost line has a vertical level that is the same as a vertical level of the first topmost line, and extends in a first direction, forming a passivation layer to cover the first and second topmost lines, forming first and second openings in the passivation layer to partially and respectively expose the first and second topmost lines, forming a signal bump in the first opening such that the signal bump is electrically connected to the TSV structure via the first topmost line and has a first width in the first direction and forming a dummy bump in the second opening such that the dummy bump contacts the second topmost line and has a second width in the first direction larger than the first width.

BRIEF DESCRIPTION OF DRAWINGS

The above and other aspects and features of the present disclosure will become more apparent by describing in detail example embodiments thereof with reference to the attached drawings, in which.

DETAILED DESCRIPTION

Figure 1:
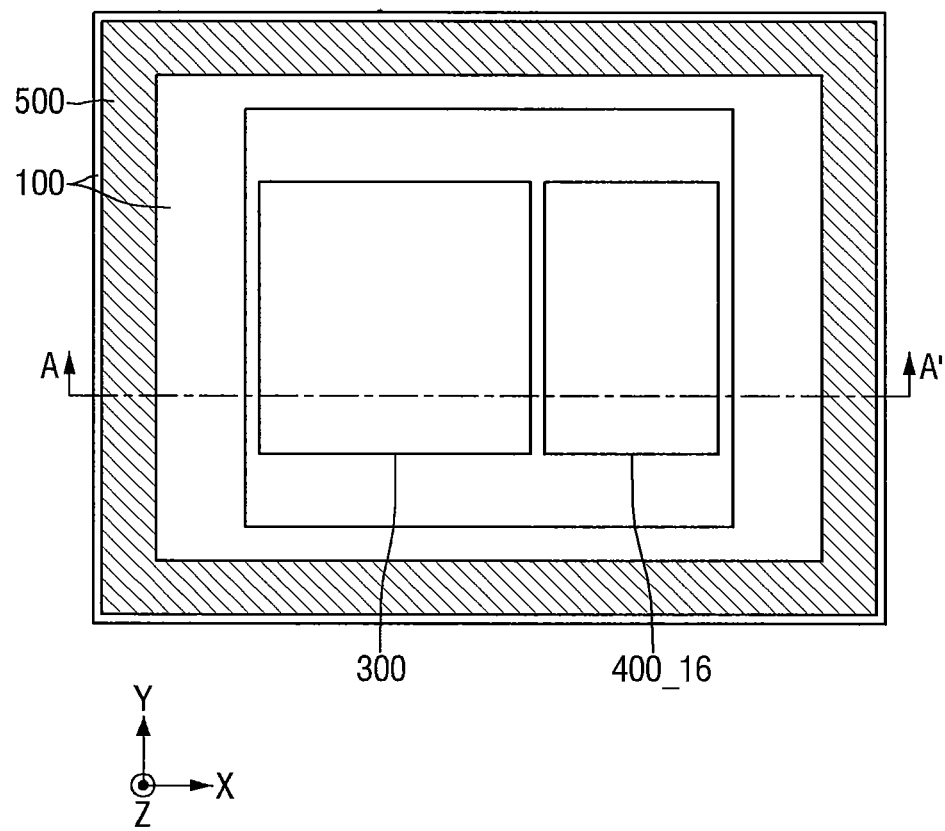
FIG. 1 is a plan view illustrating a semiconductor package according to some embodiments of the present disclosure.

Hereinafter, embodiments according to the present disclosure will be described with reference to the accompanying drawings. Throughout the various drawings of the present disclosure, like reference numerals are allocated to like elements.

Figure 2:
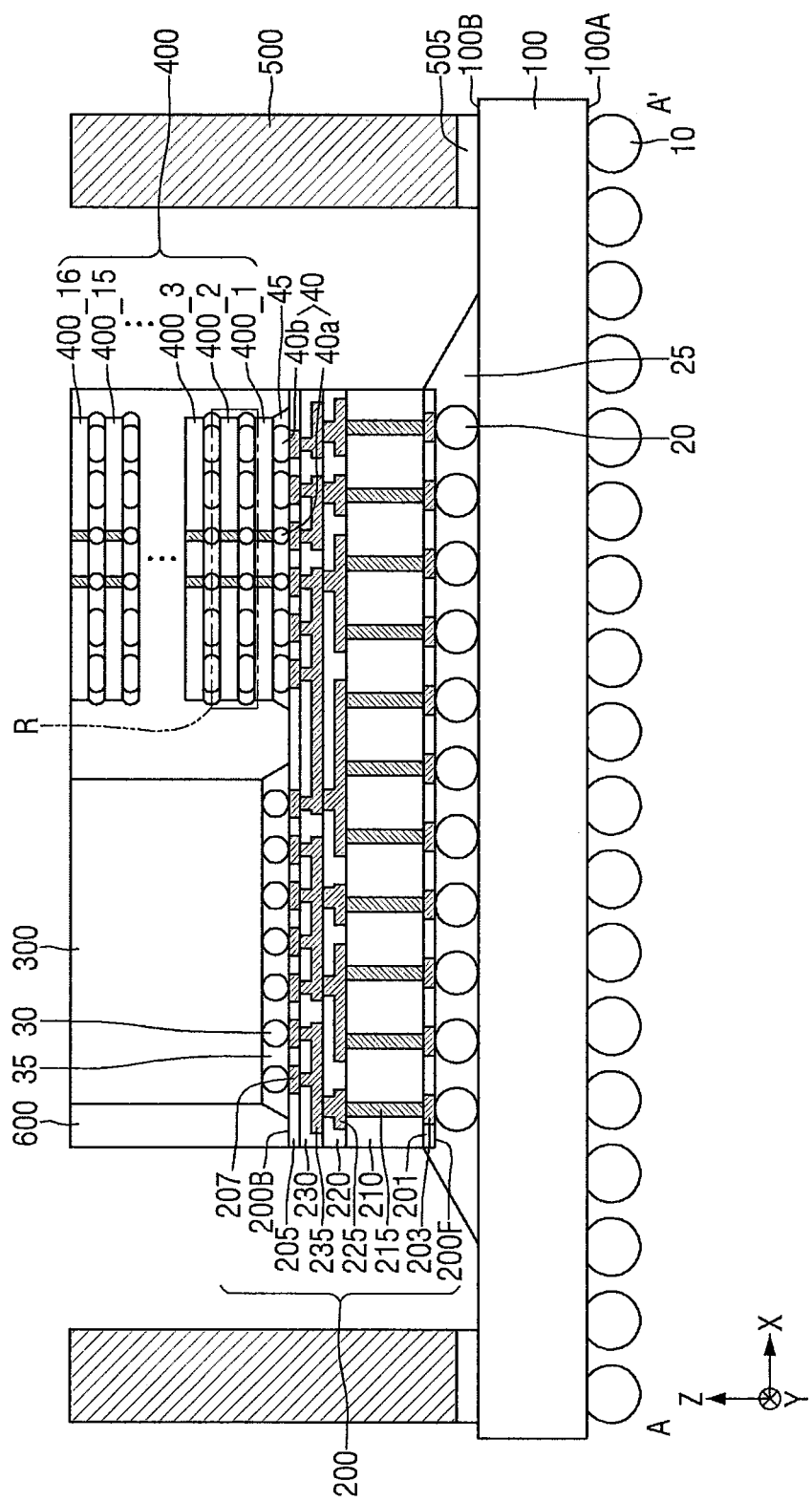
FIG. 2 is a cross-sectional view taken along a line A-A' of FIG. 1.
Figure 3:
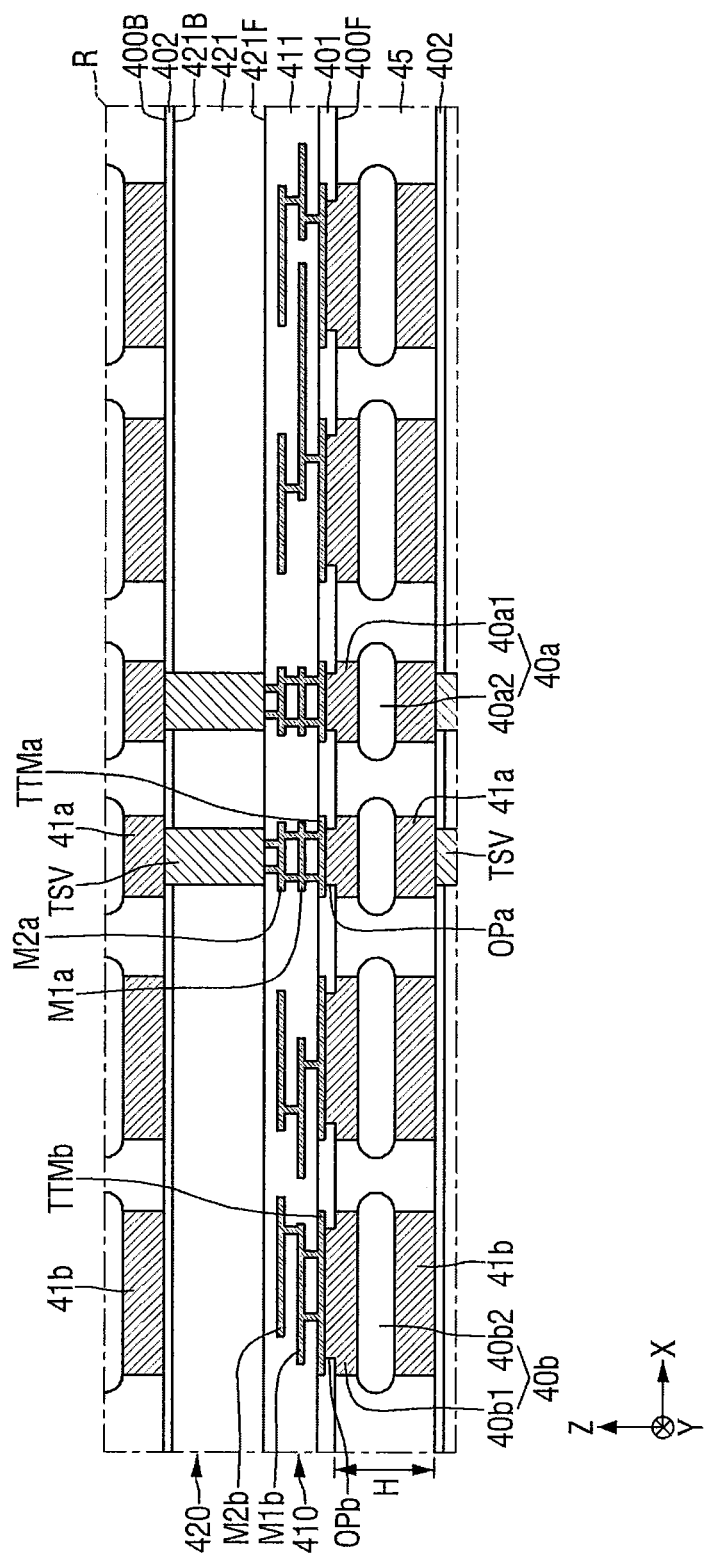
FIG. 3 is an enlarged view of an area "R" of FIG. 2.
Figure 4:
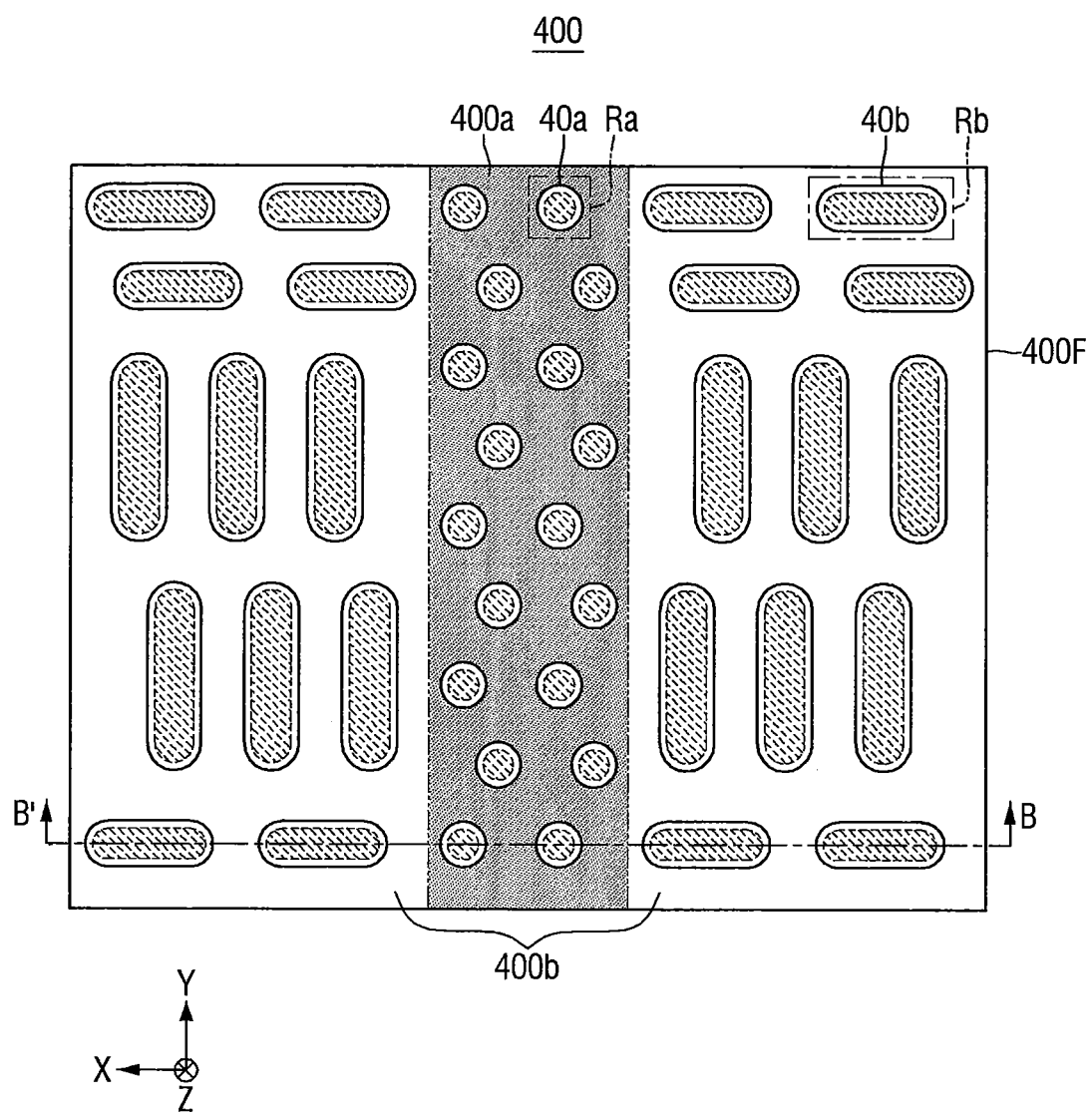
FIG. 4 is a plan view illustrating a semiconductor chip according to some embodiments of the present disclosure.
Figure 5:
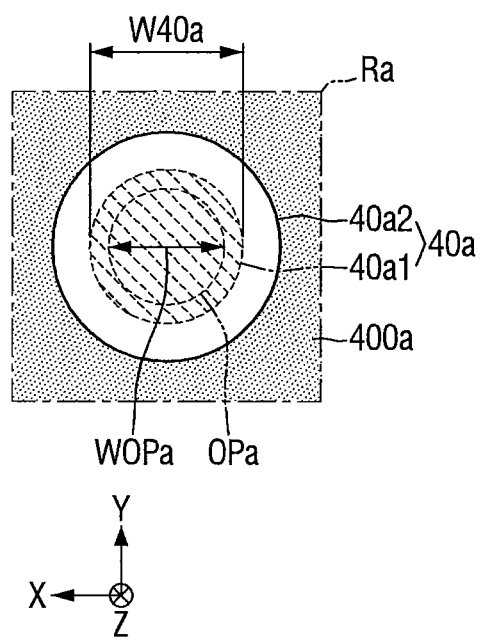
FIG. 5 is an enlarged view of an area "Ra" of FIG. 4.
Figure 6:
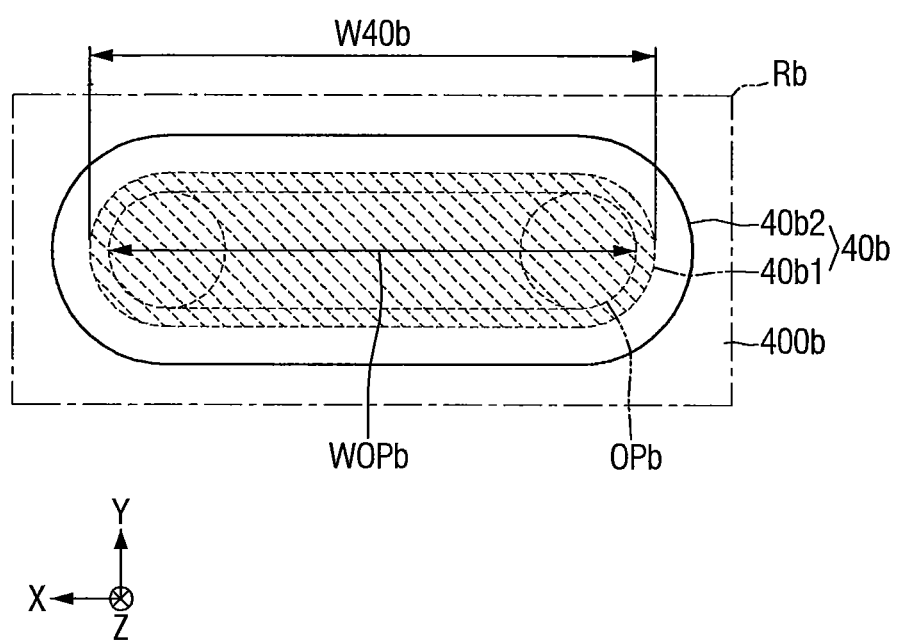
FIG. 6 is an enlarged view of an area "Rb" of FIG. 4.
Figure 7:
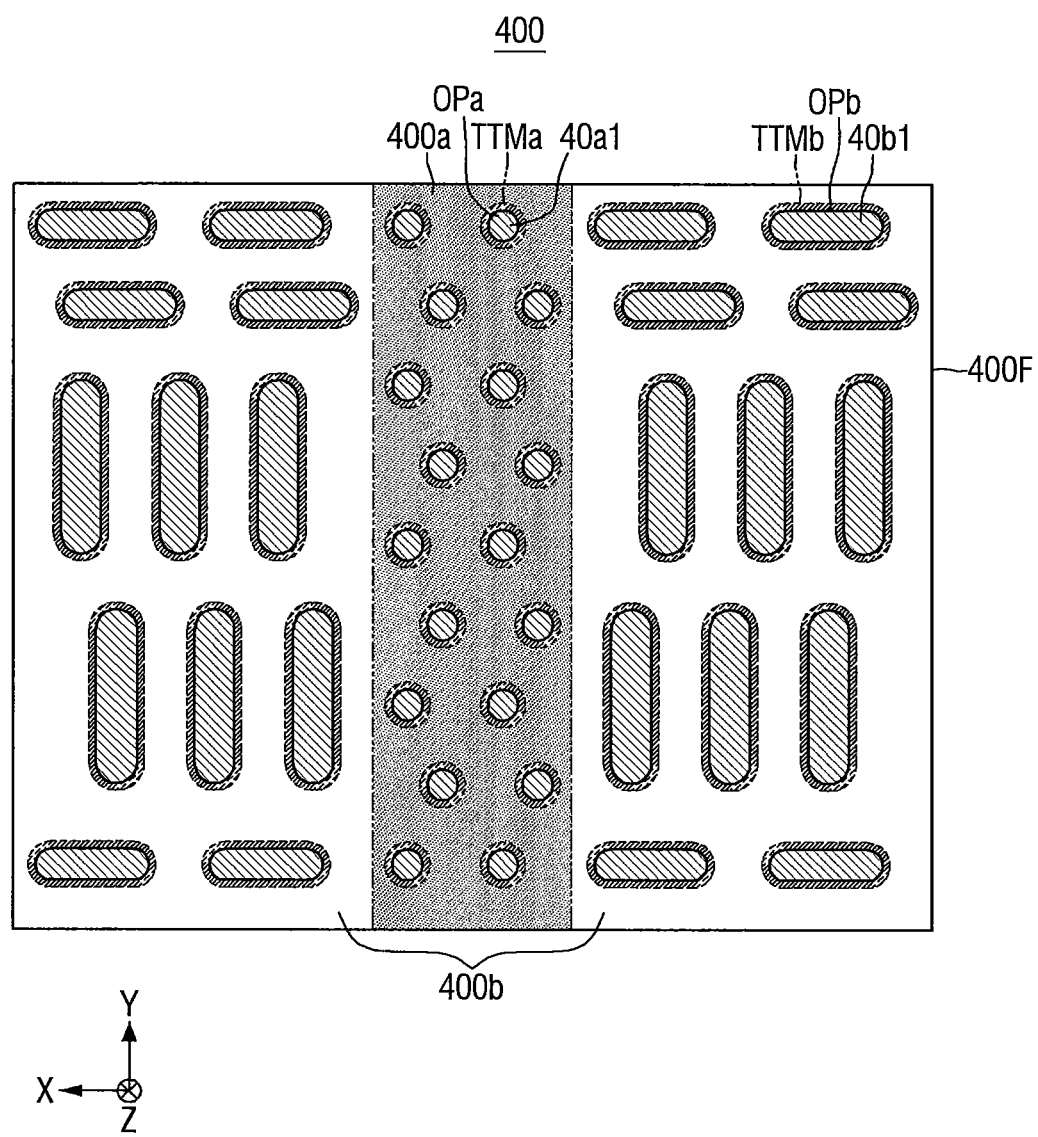
FIG. 7 is a plan view illustrating a semiconductor chip according to some embodiments of the present disclosure.

FIG. 1 is a plan view illustrating a semiconductor package according to some embodiments of the present disclosure. FIG. 2 is a cross-sectional view taken along a line A-A' of FIG. 1. FIG. 3 is an enlarged view of an area "R" of FIG. 2. FIG. 4 is a plan view illustrating a semiconductor chip according to some embodiments of the present disclosure. FIG. 5 is an enlarged view of an area "Ra" of FIG. 4. FIG. 6 is an enlarged view of an area "Rb" of FIG. 4. FIG. 7 is a plan view illustrating a semiconductor chip according to some embodiments of the present disclosure. FIG. 4 to FIG. 7 are plan views in an X-Y plane.

Referring to FIG. 1 to FIG. 7, a semiconductor package 1 may include a substrate 100, an external connection terminal 10, an underfill material 25, an internal connection terminal 20, an interposer layer 200, a first semiconductor chip 300, a second semiconductor chip 400, a stiffener 500 and a molding layer 600.

The substrate 100 may include a first face 100A and a second face 100B opposite to each other. The first face 100A of the substrate 100 may mean a bottom face of the substrate 100 in the third direction Z, while the second face 100B of the substrate 100 may mean a top face of the substrate 100 in the third direction Z.

The substrate 100 may act as a substrate for a package, and may be embodied as, for example, a printed circuit board (PCB), or a ceramic substrate. When the substrate 100 is embodied as the printed circuit board, the substrate 100 may be made of or include at least one material selected from phenol resin, epoxy resin, and polyimide. For example, the substrate 100 may include at least one material selected from among FR4, tetrafunctional epoxy, polyphenylene ether, epoxy/polyphenylene oxide, bismaleimide triazine (BT), thermount, cyanate ester, polyimide, and liquid crystal polymer. A surface of the substrate 100 may be covered with a solder resist. However, the present disclosure is not limited thereto.

The external connection terminal 10 may be disposed on the first face 100A of the substrate 100. The external connection terminal 10 may convexly (e.g., downwardly convexly) protrude from the first face 100A of the substrate 100. The external connection terminal 10 may electrically connect the semiconductor package to an external device. The external connection terminal 10 may be, for example, a Ball Grid Array (BGA).

The internal connection terminal 20 may be disposed on the second face 100B of the substrate 100. The internal connection terminal 20 may be disposed between the substrate 100 and the interposer layer 200. The internal connection terminal 20 may convexly (e.g., upwardly convexly) protrude from the second face 100B of the substrate 100. In FIG. 2, the internal connection terminal 20 is shown as having a shape of a ball. However, the present disclosure is not limited thereto. In addition, the internal connection terminal 20 may have substantially the same size or shape as that of the external connection terminal 10, or may have a different size or shape therefrom as shown in FIG. 2. For example, the internal connection terminal 20 may have a size smaller than that of the external connection terminal 10.

The external connection terminal 10 and the internal connection terminal 20 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof. However, the present disclosure is not limited thereto.

The underfill material 25 may be disposed between the substrate 100 and the interposer layer 200. The underfill material 25 may be disposed between the second face 100B of the substrate 100 and a fourth face 200B of the interposer layer 200. The underfill material 25 may surround the internal connection terminal 20. The underfill material 25 may protect the internal connection terminal 20.

The underfill material 25 may include, for example, an epoxy-based resin, benzocyclobutene (BCB) or polyimide. However, embodiments are not limited thereto. For example, the underfill material 25 may further include silica filler. In another example, the underfill material 25 may include adhesives and flux. The flux may include an oxide film remover. In still another example, the underfill material 25 may include silica filler or flux. In still another example, the underfill material 25 may include a non-conductive paste.

The interposer layer 200 may include a third face 200F and a fourth face 200B facing toward each other or opposite to each other. The third face 200F of the interposer layer 200 may mean a bottom face of the interposer layer 200 in the third direction Z, and the fourth face 200B of the interposer layer 200 may mean a top face of the interposer layer 200 in the third direction Z.

The interposer layer 200 may include a first passivation layer 201, a second passivation layer 205, a substrate layer 210, a first layer 220, and a second layer 230.

The third face 200F of the interposer layer 200 may constitute a bottom face of the first passivation layer 201 in the third direction Z. The first passivation layer 201 may include a first connective pad 203. The first passivation layer 201 may expose at least a portion of the first connective pad 203. The first connective pad 203 may include a conductive material and may be electrically connected to one or more internal connection terminals 20. Accordingly, the interposer layer 200 may be bonded and electrically connected to the substrate 100 via the internal connection terminal 20. The first passivation layer 201 may include, for example, an oxide film or a nitride film, but is not limited thereto.

The fourth face 200B of the interposer layer 200 may constitute a top face of the second passivation layer 205 in the third direction Z. The second passivation layer 205 may include a second connective pad 207. The second passivation layer 205 may expose at least a portion of the second connective pad 207. The second connective pad 207 may include a conductive material and may be electrically connected to at least one first bump 30 and at least one second bump 40. Accordingly, the interposer layer 200 may be bonded and electrically connected to the first semiconductor chip 300 and the second semiconductor chip 400 via the first bump 30 and the second bump 40. The second passivation layer 205 may include, for example, an oxide film or a nitride film, but is not limited thereto.

The substrate layer 210 may be disposed on the first passivation layer 201. The substrate layer 210 may include, for example, silicon (Si). The substrate layer 210 may receive therein a first through-via 215. The first through-via 215 may be disposed within the substrate layer 210. The first through-via 215 may extend through the substrate layer 210. The first through-via 215 may extend in a shape varying depending on whether the first through-via 215 is formed before a front end of line (FEOL) process, between the FEOL process and a back end of line (BEOL) process, or during or after the BEOL process.

The first layer 220 may include an insulating material and be disposed on the substrate layer 210. A first line 225 may include a conductive material and may be disposed in the first layer 220. The first line 225 may be disposed on the first through-via 215 and may be electrically connected to the first through-via 215.

The second layer 230 may include an insulating material and may be disposed between the first layer 220 and the second passivation layer 205. A second line 235 may include a conductive material and may be disposed in the second layer 230. The second line 235 may be disposed on the first line 225 and may be electrically connected to the first line 225, and may be electrically connected to the second connective pad 207 of the second passivation layer 205.

The insulating material of the first layer 220 or the second layer 230 may include a photosensitive insulating material, an organic polymer material, polybenzoxazole (PBO), etc.

However, the present disclosure is not limited thereto. The conductive material of the first line 225 or the second line 235 may include, for example, at least one of copper (Cu), aluminum (Al), silver (Ag), tin (Sn), gold (Au), nickel (Ni), lead (Pb), titanium (Ti), or alloys thereof. However, the present disclosure is not limited thereto.

The first semiconductor chip 300 and the second semiconductor chip 400 may be disposed on the fourth face 200B of the interposer layer 200. The first semiconductor chip 300 and the second semiconductor chip 400 may be spaced apart from each other in a first direction X and may not overlap each other in a plan view. For example, the first semiconductor chip 300 and the second semiconductor chip 400 may be spaced apart from each other in the first direction X and may be disposed on the fourth face 200B of the interposer layer 200. In FIG. 2, two types of semiconductor chips, that is, the first semiconductor chip 300 and the second semiconductor chip 400 are shown. However, the present disclosure is not limited thereto. The number and types of semiconductor chips may vary.

The first semiconductor chip 300 may act as, for example, a logic chip. For example, the logic chip may be embodied as a Central Processor Unit (CPU), a Micro Processor Unit (MPU), a Graphic Processor Unit (GPU), a controller, an Application Specific Integrated Circuit (ASIC), or a modem chip. Alternatively, the first semiconductor chip 300 may act as an Application Processor (AP) used in a mobile phone or a smart phone.

The first bump 30 may be disposed on a top face of the first semiconductor chip 300. The first bump 30 may be disposed on the interposer layer 200, and may contact and be electrically connected to the second connective pad 207. A first underfill material 35 may be disposed between the first semiconductor chip 300 and the interposer layer 200. The first underfill material 35 may be disposed between the fourth face 200B of the interposer layer 200 and a top face of the first semiconductor chip 300. The first underfill material 35 may surround the first bump 30. The first underfill material 35 may protect the first bump 30. Specific descriptions of a material of the first underfill material 35 may be replaced with the description of the underfill material 25 as described above.

The second semiconductor chip 400 may act as a memory chip different from the first semiconductor chip 300. The second semiconductor chip 400 may act as, for example, a semiconductor memory chip. For example, the semiconductor memory chip may be embodied as a volatile memory chip such as Dynamic Random Access Memory (DRAM) or Static Random Access Memory (SRAM)), or as a non-volatile memory chip such as Phase-change Random Access Memory PRAM, Magnetoresistive Random Access Memory (MRAM), Ferroelectric Random Access Memory (FeRAM), or Resistive Random Access Memory (RRAM). In addition, the memory chip may be embodied as a High Bandwidth Memory (HBM) semiconductor memory chip in which a plurality of DRAM memory chips are stacked.

The second semiconductor chip 400 may include second-first to second-sixteenth semiconductor chips 400_1 to 400_16 which may be sequentially stacked in the third direction Z on the interposer layer 200. In one example, the second-second to second-sixteenth semiconductor chips 400_2 to 400_16 may constitute an HBM semiconductor memory chip, while the underlying second-first semiconductor chip 400_1 may act as a memory controller. In this way, the second semiconductor chip 400 may act as a Hybrid Memory Cube (HMC) memory chip.

The second bump 40 may be disposed on a top face of the second semiconductor chip 400. The second bump 40 may be disposed on the interposer layer 200 or a top face of another second semiconductor chip 400, and may contact and be electrically connected to the second connective pad 207. A second underfill material 35 may be disposed between the second semiconductor chip 400 and the interposer layer 200 or between the second semiconductor chips 400. The second underfill material 45 may be disposed between the fourth face 200B of the interposer layer 200 and a top face of the second semiconductor chip 400 or between faces (e.g., top faces) of the second semiconductor chips 400. The second underfill material 45 may surround the second bump 40. The second underfill material 45 may protect the second bump 40. Detailed description of a material of the second underfill material 45 may be replaced with the description of the underfill material 25 as described above.

Referring to FIG. 3, an area "R" of FIG. 2 is enlarged based on the second-second semiconductor chip 400_2. However, the second-first to second-sixteenth semiconductor chips 400_1 to 400_16 may have the same configuration. Thus, FIG. 3 may be equally applied to each of the second-first to second-sixteenth semiconductor chips 400_1 to 400_16. Accordingly, for ease of description, a configuration of each of the second-first to second-sixteenth semiconductor chips 400_1 to 400_16 is described in detail based on a corresponding configuration of the second semiconductor chip 400 in FIG. 3.

Referring to FIG. 3 to FIG. 7, the second semiconductor chip 400 includes a passivation layer 401, a first topmost line TTMa, a second topmost line TTMb, a second signal bump 40a, a second dummy bump 40b, a redistribution layer 410, a semiconductor element layer 420, a rear passivation layer 402, a first rear line 41a and a second rear line 41b.

The second semiconductor chip 400 may include a front face 400F and a rear face 400B facing toward each other or opposite each other. The front face 400F of the second semiconductor chip 400 may mean a bottom face of the second semiconductor chip 400 in the third direction Z, and the rear face 400B of the substrate 100 may mean a top face of the second semiconductor chip 400 in the third direction Z.

The second semiconductor chip 400 includes a bump area 400a extending in a second direction Y and containing the second signal bump 40a, and a dummy bump area 400b that does not overlap the bump area 400a in a plan view and contains the second dummy bump 40b. The bump area 400a includes a TSV structure TSV disposed below the second signal bump 40a and electrically connected to the second signal bump 40a.

The front face 400F of the second semiconductor chip 400 may constitute a top face of the passivation layer 401. The passivation layer 401 receives or includes therein a first opening OPa and a second opening OPb. A portion of the first topmost line TTMa and a portion of the second topmost line TTMb may be exposed respectively through the first opening OPa and the second opening OPb defined in the passivation layer 401. At least a portion of the passivation layer 401 covers a portion of each of the topmost lines TTMa and TTMb, and is disposed between the topmost lines TTMa and TTMb and the second bumps 40a and 40b. The passivation layer 401 may include, for example, an oxide film or a nitride film, but is not limited thereto.

The first opening OPa is formed in the bump area 400a, and has a circular planar shape, and has a first opening width WOPa. The first opening width WOPa is in a range of 5 μm to 15 μm.

The second opening OPb is formed in the dummy bump area 400b, and has an elliptical or rounded rectangular planar shape and has a second opening width WOPb. The second opening width WOPb is in a range of 10 μm to 75 μm.

In one example, when the second topmost line TTMb exposed through the second opening OPb extends in the first direction X, the second opening OPb may also extend in the first direction X. When the second topmost line TTMb exposed through the second opening OPb extends in the second direction Y, the second opening OPb also extends in the second direction Y. According to the present disclosure, the first opening width WOPa is smaller than the second opening width WOPb.

The first topmost line TTMa is disposed on the redistribution layer 410 and in the bump area 400a, and has a circular planar shape and is partially exposed through the first opening OPa defined in the passivation layer 401.

The second topmost line TTMb has the same vertical level as that of the first topmost line TTMa and is disposed on the redistribution layer 410 and in the dummy bump area 400b, and has an elliptical or rounded rectangular planar shape and is partially exposed through the second opening OPb defined in the passivation layer 401. The second topmost line TTMb may extend in the first direction X or the second direction Y.

The second signal bump 40a is disposed on the first opening OPa and the first topmost line TTMa and in the bump area 400a and contacts and is electrically connected to the first topmost line TTMa, and electrically connects the corresponding second semiconductor chip 400 to an underlying second semiconductor chip 400 or to the interposer layer 200. A first width W40a of the second signal bump 40a is in a range of 10 μm to 20 μm.

The second signal bump 40a may include a signal pillar 40a1 and a signal solder 40a2. The signal pillar 40a1 may be disposed on the first opening OPa and the first topmost line TTMa and may be in contact with the first topmost line TTMa, and may be electrically connected to a pad of a package substrate, a pad of the interposer layer, or a rear line of another chip via the signal pillar 40a1.

The signal pillar 40a1 may include at least one of tin (Sn), tin alloy (Sn—Bi, Sn—Ag, Sn—Cu, Sn—Ag, Sn—Ag—Cu), indium (In), lead (Pb), zinc (Zn), nickel (Ni), gold (Au), silver (Ag), copper (Cu), antimony (Sb), bismuth (Bi), and combinations thereof. However, the present disclosure is not limited thereto.

The second signal bump 40a includes the signal solder 40a2. Thus, when the second signal bump 40a is connected to a first rear line 41a of another chip, the signal pillar 40a1 may be bonded to the first rear line 41a without forming a solder on the first rear line 41a.

The second dummy bump 40b may be disposed on the second opening OPb and the second topmost line TTMb and in the dummy bump area 400b and may contact the second topmost line TTMb, and may be in contact with a second rear line 41b of an underlying second semiconductor chip 400. A second width W40b of the second dummy bump 40a may extend along an extension direction of the second topmost line TTMb. The second width W40b is within a range of 15 μm to 80 μm. The second width W40b is greater than the first width W40a.

The second dummy bump 40b may include a dummy pillar 40b1 and a dummy solder 40b2. The dummy pillar 40b1 may be disposed on the second opening OPb and the second topmost line TTMb and may contact the second topmost line TTMb, and may contact the pad of the package substrate, the pad of the interposer layer, or the rear line of another chip via the dummy pillar 40b1.

The dummy pillar 40b1 may include at least one of tin (Sn), tin alloy (Sn—Bi, Sn—Ag, Sn—Cu, Sn—Ag, Sn—Ag—Cu), indium (In), lead (Pb), zinc (Zn), nickel (Ni), gold (Au), silver (Ag), copper (Cu), antimony (Sb), bismuth (Bi), and combinations thereof. However, the present disclosure is not limited thereto.

The second dummy bump 40b includes the dummy solder 40b2. Thus, when the second dummy bump 40b is connected to a second rear line 41b of another chip, the dummy pillar 40b1 may be bonded to the second rear line 41b without forming a solder on the second rear line 41b.

The redistribution layer 410 includes an insulating layer 411, signal lines M1a and M2a and dummy lines M1b and M2b.

The insulating layer 411 may include an insulating material and may be disposed between the topmost lines TTMa and TTMb and the semiconductor element layer 420. The signal lines M1a and M2a may include a conductive material and may be disposed in the insulating layer 411 and in the bump area 400a, and may be disposed below, contact and be electrically connected to the first topmost line TTMa. The dummy lines M1b and M2b may include a conductive material and may be disposed in the insulating layer 411 and in the dummy bump area 400b, and may be disposed below, contact and be electrically connected to the second topmost line TTMb.

The signal lines M1a and M2a may be disposed on the TSV structure TSV to be described below to electrically connect the first topmost line TTMa and the TSV structure TSV to each other.

The semiconductor element layer 420 may include a semiconductor substrate 421 and the TSV structure TSV. Although a FEOL structure may be on the semiconductor substrate 421, it is understood by those skilled in the semiconductor field that the FEOL structure including a plurality of individual elements constituting a semiconductor element may be disposed between the semiconductor substrate 421 and the redistribution layer 410.

The semiconductor substrate 421 may include a front face 421F and a rear face 421B facing toward each other or opposite each other. The front face 421F may face toward the topmost lines TTMa and TTMb, while the rear face 421B may face the rear passivation layer 402.

The semiconductor substrate 421 may include, for example, silicon (Si). The TSV structure TSV may be disposed in the bump area 400a and overlap at least a portion of the first topmost line TTMa in a plan view (or be vertically aligned with at least a portion of the first topmost line TTMa), and may vertically extend through the semiconductor substrate 421, and may be exposed through an opening defined in the rear passivation layer 402 disposed on the rear face of the semiconductor substrate 421.

The TSV structure TSV exposed through the opening defined in the rear passivation layer 402 is in contact with the first rear line 41a and is electrically connected thereto. The second rear line 41b is disposed on the rear passivation layer 402 and may have the same vertical level as that of the first rear line 41a and is disposed in the dummy bump area 400b.

The rear lines 41a and 41b may be respectively bonded to second bumps 40a and 40b of another second semiconductor chip 400. The second underfill material 45 may be disposed between the rear face 400B of the second semiconductor chip 400 and a front face 400F of another semiconductor chip 400. A thickness H of the second underfill material 45 disposed between the rear face 400B of the second semiconductor chip 400 and the front face 400F of another semiconductor chip 400 is within a range of 8 μm to 12 μm.

The stiffener 500 may be disposed on and bonded to the second face 100B of the substrate 100 via an adhesive layer 505. The stiffener 500 may be disposed on the second face 100B of the substrate 100, and may be spaced apart from the interposer layer 200 in the first and second directions X and Y. That is, the stiffener 500 may surround the interposer layer 200. The stiffener 500 may inhibit or prevent warpage from occurring in the substrate 100 and/or the interposer layer 200.

The molding layer 600 may be disposed on the fourth face 200B of the interposer layer 200. The molding layer 600 may fill a space between each of the first semiconductor chip 300 and the second semiconductor chip 400 and the interposer layer 200.

In FIG. 2, the molding layer 600 is illustrated as covering a side face of each of the first semiconductor chip 300 and the second semiconductor chip 400 and exposing a top face thereof. However, this is only an example. In another example, the molding layer 600 may cover the side and top faces of each of the first semiconductor chip 300 and the second semiconductor chip 400. The molding layer 600 may include an insulating material.

For example, the molding layer 600 may include a thermosetting resin such as an epoxy resin, a thermoplastic resin such as polyimide, or a mixture thereof with an inorganic filler, or a product (e.g., prepreg, Ajinomoto Build-up Film (ABF), FR-4, Bismaleimide Triazine (BT) obtained by impregnating a core material such as glass fiber, glass cloth, or glass fabric with the resin and the inorganic filler. Alternatively, the molding layer 600 may include a photosensitive insulating material (PID; Photo Imageable Dielectric).

In the second semiconductor chip 400 according to some embodiments of the present disclosure, an area of the second dummy bump 40b is relatively wider or greater than that of the second signal bump 40a, thereby improving thermal characteristics of the chip. Further, increasing the area of the second dummy bump 40b may allow reduction of a planar area of the second underfill material 45 (e.g., a non-conductive paste) having thermal insulation ability, thereby improving thermal characteristics of the chip.

In the second semiconductor chip 400 according to some embodiments of the present disclosure, the second dummy bump 40b and the second topmost line TTMb are brought into contact with each other, and the second dummy bump 40b and the second rear line 41b are bonded to each other, thereby increasing heat transfer efficiency between adjacent chips, thereby improving thermal characteristics of a combination of the chips.

Figure 10:
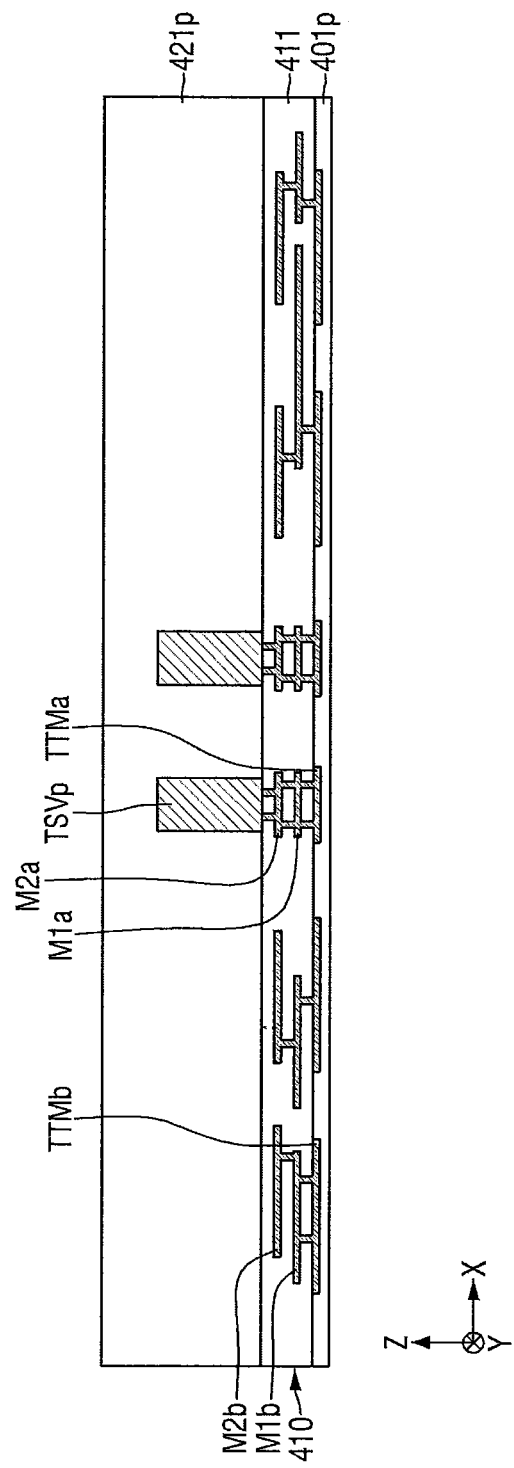
Figure 11:
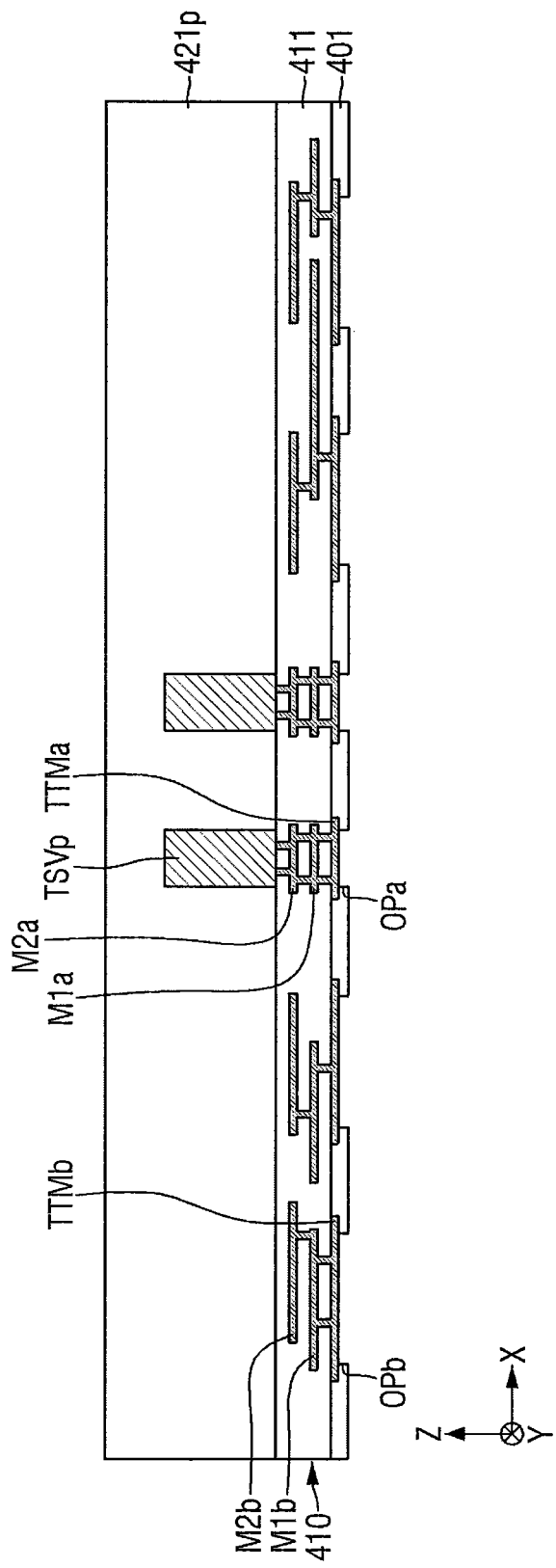
Figure 12:
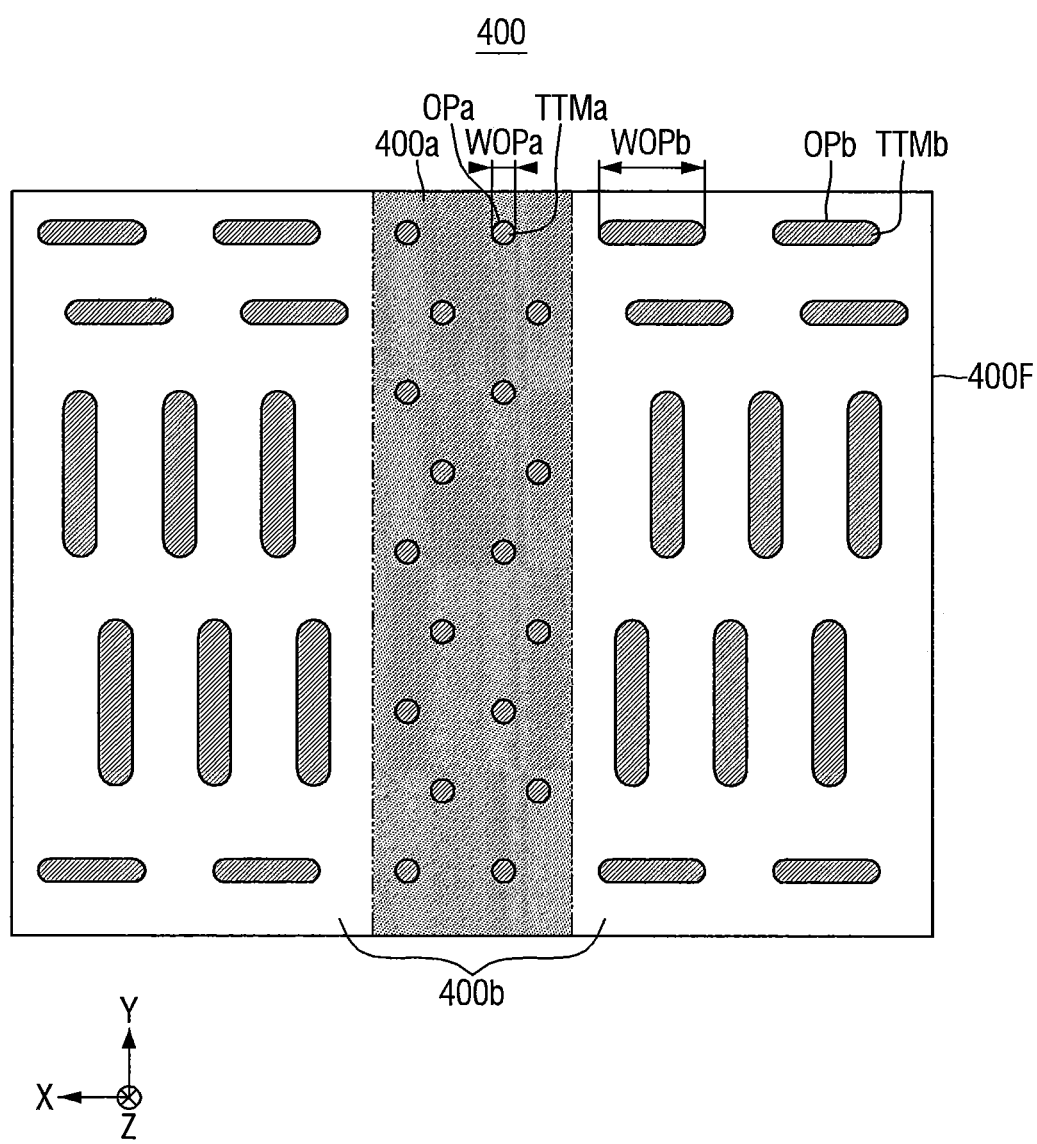

FIG. 8 to FIG. 17 are diagrams of intermediate steps illustrating a method for manufacturing a semiconductor package according to some embodiments of the present disclosure. FIG. 12 is a plan view to illustrate a manufacturing step in FIG. 11.

Figure 8:
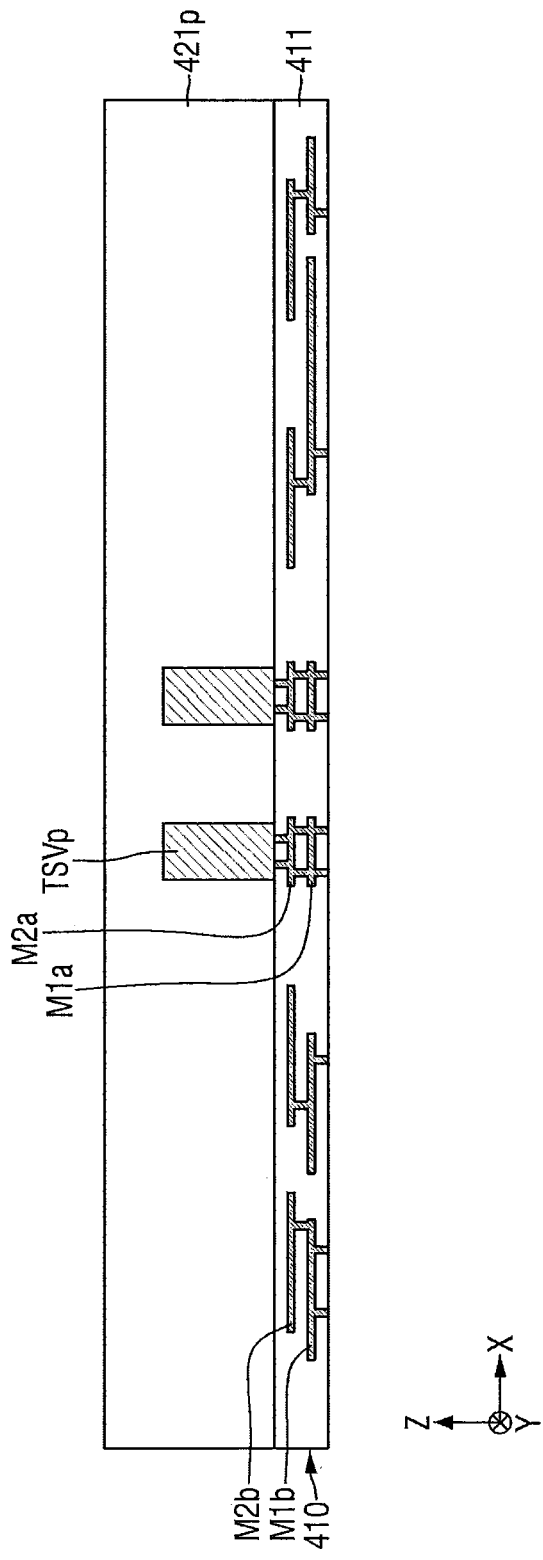
FIG. 8 to FIG. 17 are diagrams of intermediate steps illustrating a method for manufacturing a semiconductor package according to some embodiments of the present disclosure.

Referring to FIG. 8, after a BEOL process for the second semiconductor chip 400 or during the BEOL process, the redistribution layer 410 is disposed on a top face of a product from the BEOL process. Then, a semiconductor substrate 421p including the bump area 400a and the dummy bump area 400b that does not overlap the bump area 400a in a plan view (or horizontally) is disposed on the redistribution layer

410. Accordingly, a FEOL structure (not shown) is disposed between the redistribution layer 410 and the semiconductor substrate 421p.

The semiconductor substrate 421p receives therein a TSV structure TSVp extending in the third direction Z and disposed in the bump area 400a. The TSV structure TSVp is electrically connected to the signal lines M1a and M2a.

Figure 9:
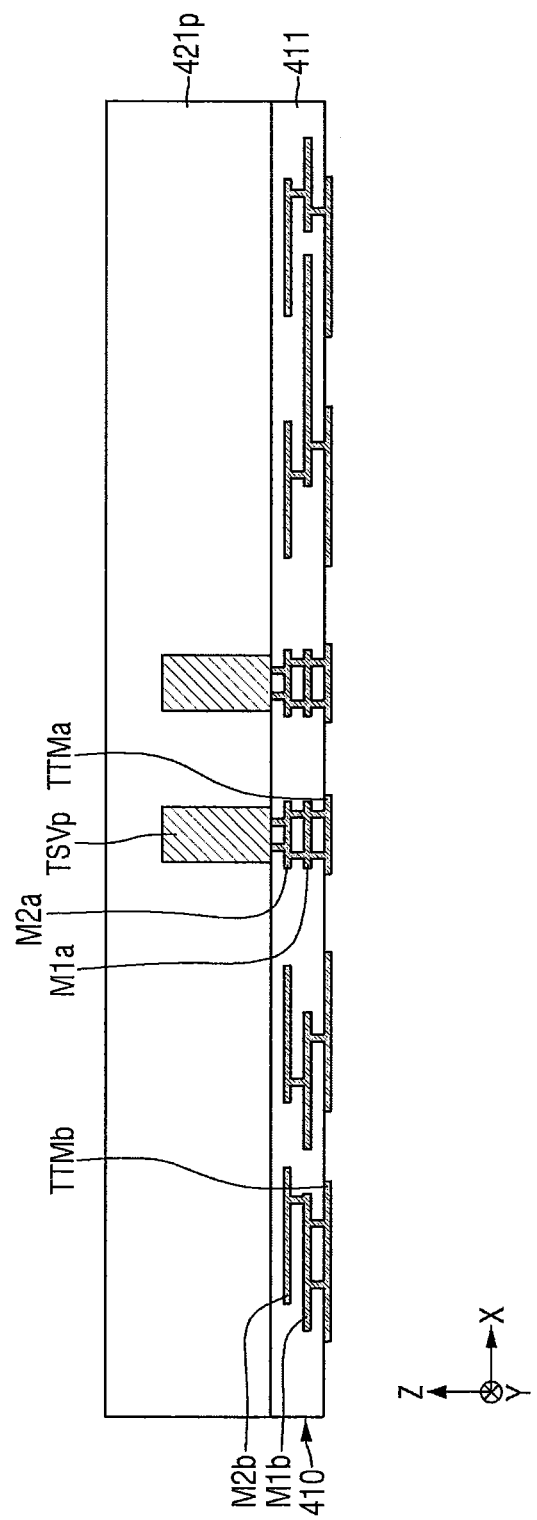

Referring to FIG. 9, the first topmost line TTMa electrically connected to the TSV structure TSVp is formed on the signal lines M1a and M2a and in the bump area 400a. In the dummy bump area 400b, the second topmost line TTMb in contact with the dummy lines M1b and M2b and having the same vertical level as that of the first topmost line TTMa is formed.

Referring to FIG. 10, a pre-passivation layer 401p is formed on the redistribution layer 410 to cover the first topmost line TTMa and the second topmost line TTMb. The pre-passivation layer 401p may be formed using a physical vapor deposition, a chemical vapor deposition, a plasma enhanced CVD, or an atomic layer deposition. However, the present disclosure is not limited thereto.

Referring to FIG. 11 and FIG. 12, in the bump area 400a, the first opening OPa exposing at least a portion of the first topmost line TTMa is formed in the pre-passivation layer 401p. The second opening OPb exposing at least a portion of the second topmost line TTMb is formed in the dummy bump area 400b. Thus, the passivation layer 401 is obtained. For example, the openings OPa and OPb may be formed using an exposure/etch/strip process. However, the present disclosure is not limited thereto.

Figure 13:
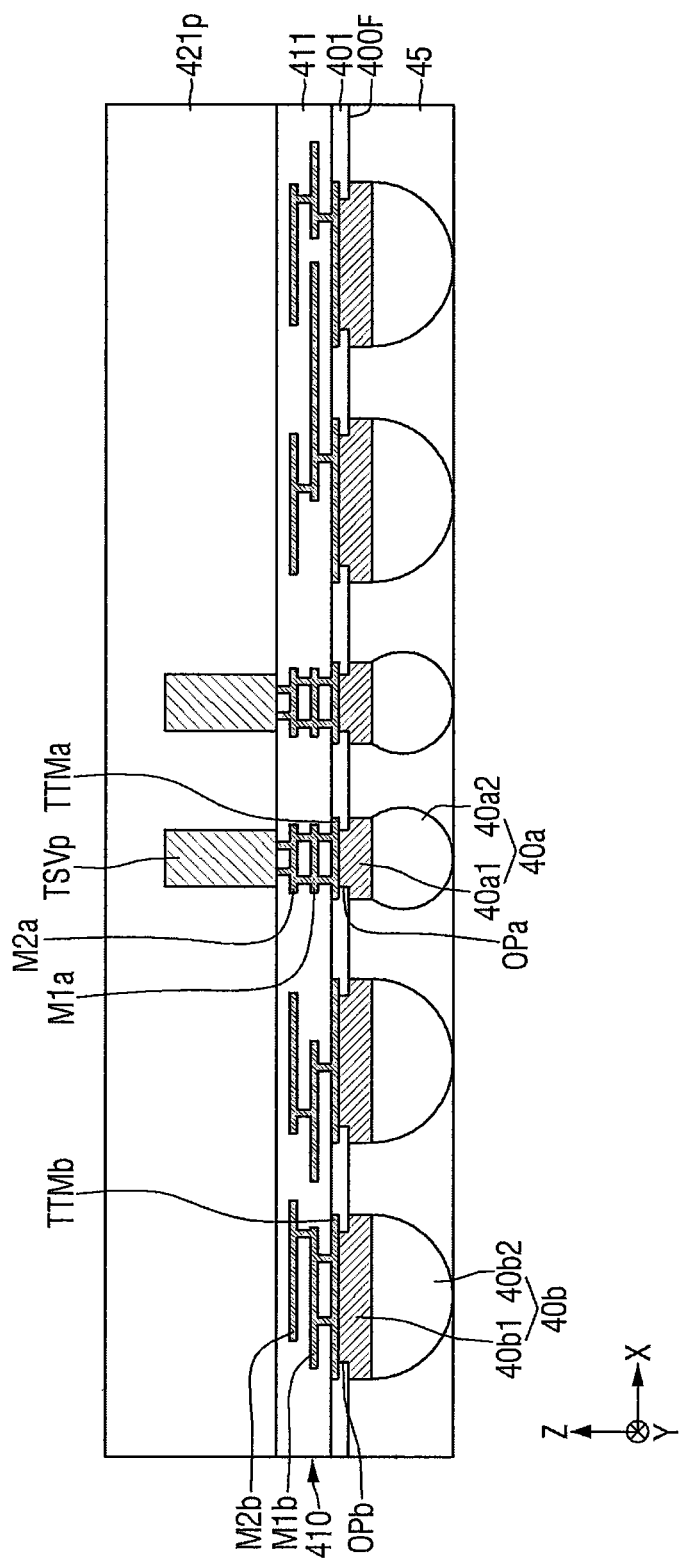

Referring to FIG. 13, the second signal bump 40a electrically connected to the TSV structure TSVp is formed on the first opening OPa. The second dummy bump 40b is formed on the second opening OPb. Further, the second underfill material 45 covering the second bumps 40a and 40b is formed.

Figure 14:
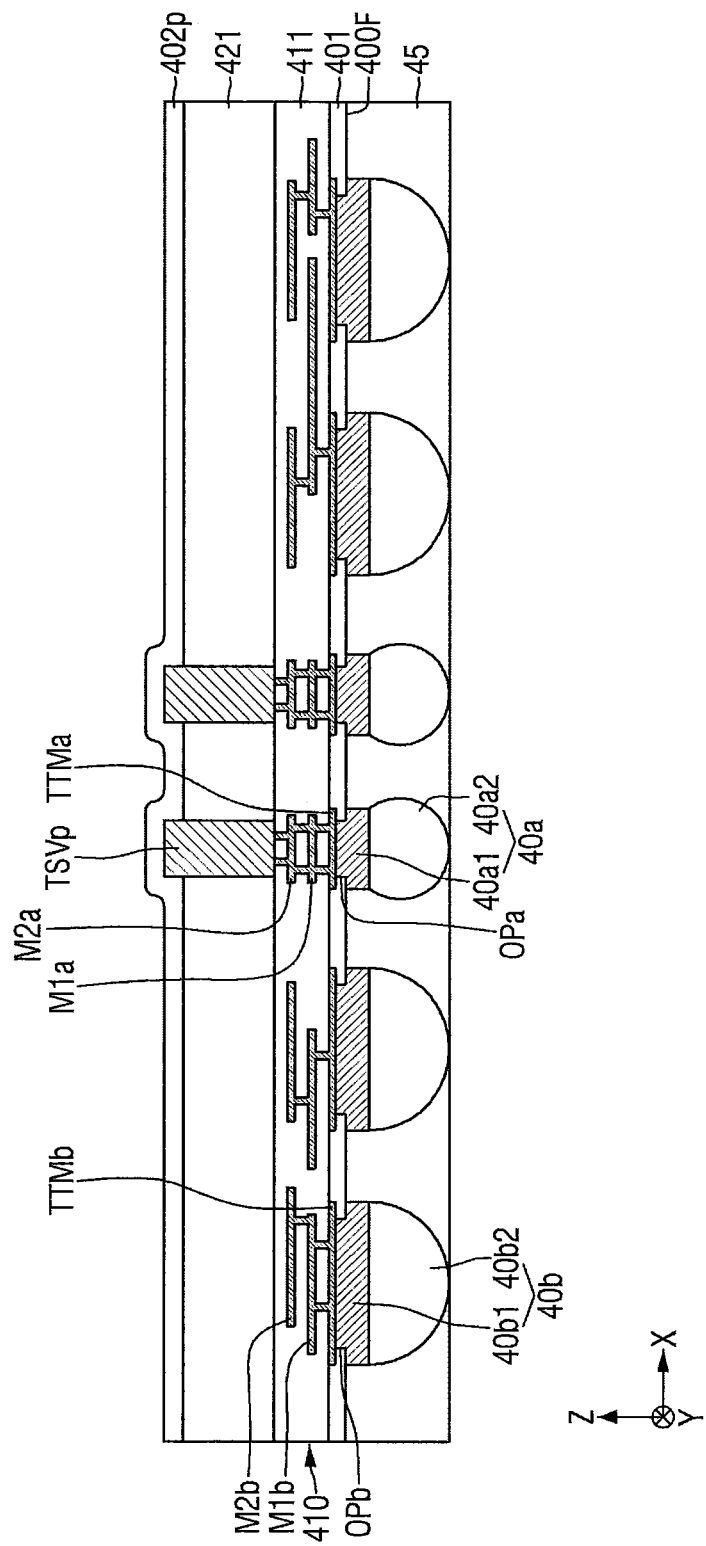

Referring to FIG. 14, a portion of the semiconductor substrate 421p is etched such that the TSV structure TSVp is exposed out of the semiconductor substrate 421. Dry etching, wet etching, etc. may be used for the etching process. However, the present disclosure is not limited thereto.

After the etching process, a pre-rear passivation layer 402p is formed on the semiconductor substrate 421 and the TSV structure TSVp. An atomic layer deposition may be used when forming the pre-rear passivation layer 402p. However, the present disclosure is not limited thereto.

Figure 15:
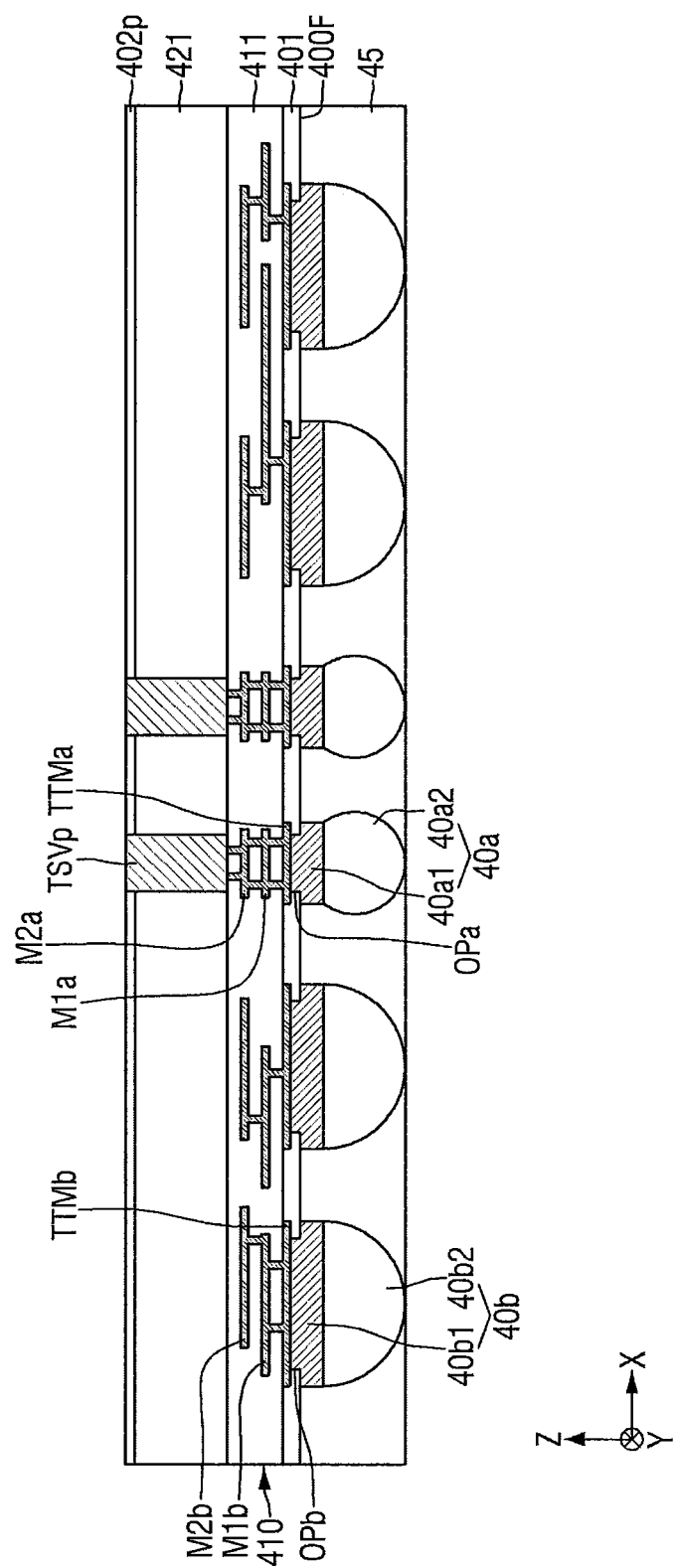

Referring to FIG. 15, a planarization (CMP) process is performed on the TSV structure TSVp and the pre-rear passivation layer 402p so that a bottom face of the TSV structure TSV is exposed out of the rear passivation layer 402.

Figure 16:
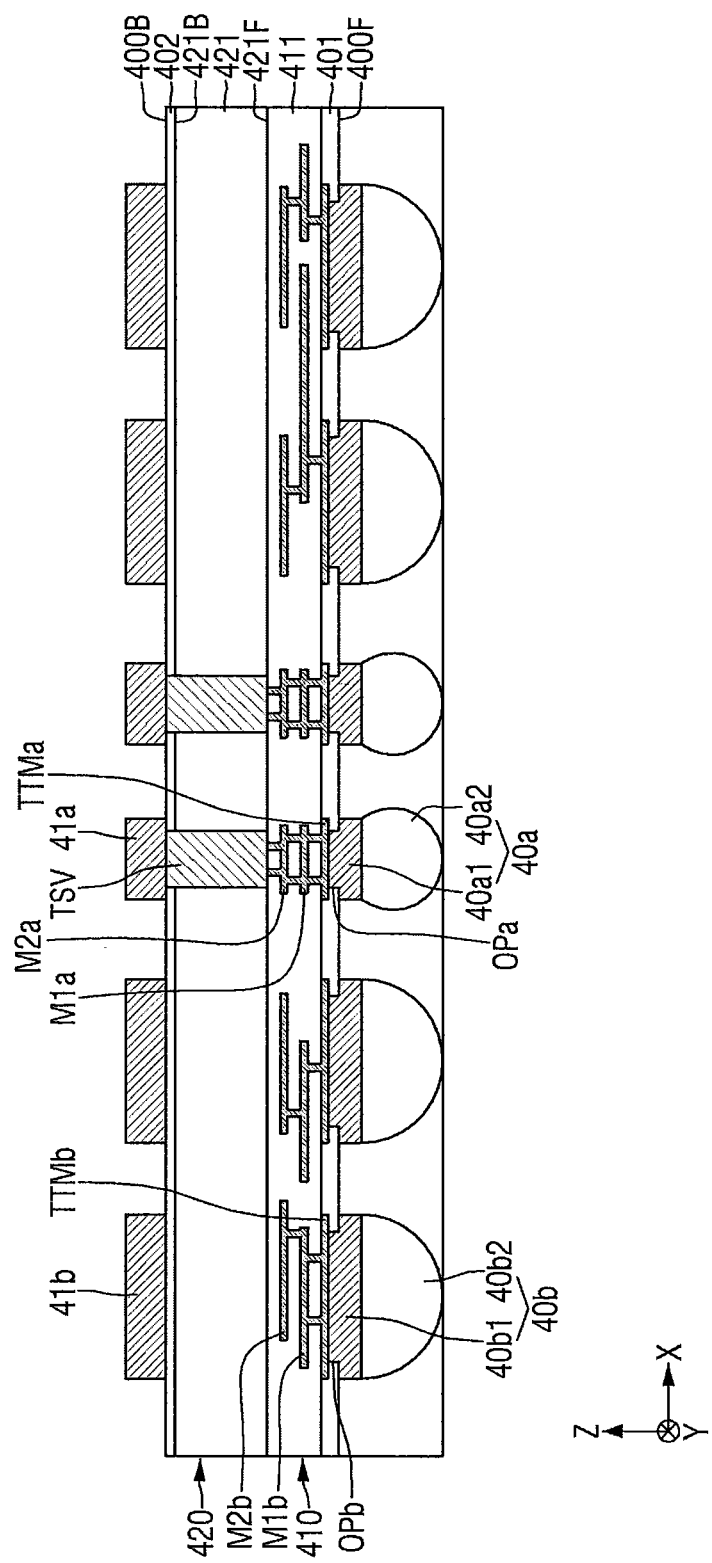

Referring to FIG. 16, the first rear line 41a is formed on the rear passivation layer 402 so as to contact the TSV structure TSV. The second rear line 41b is formed on the rear passivation layer 402 and in the dummy bump area 400b so as to have the same vertical level as that of the first rear line 41a.

Figure 17:
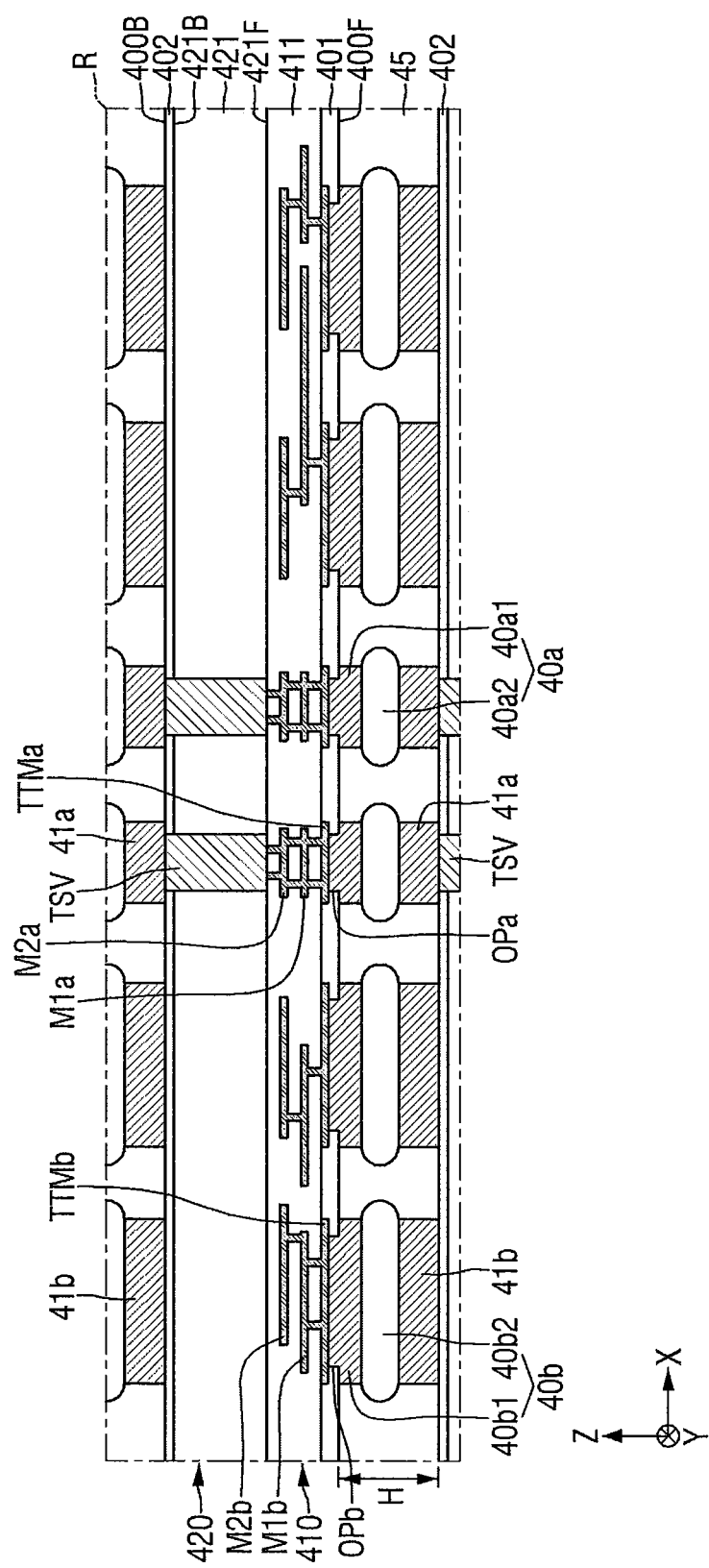
Figure 18:
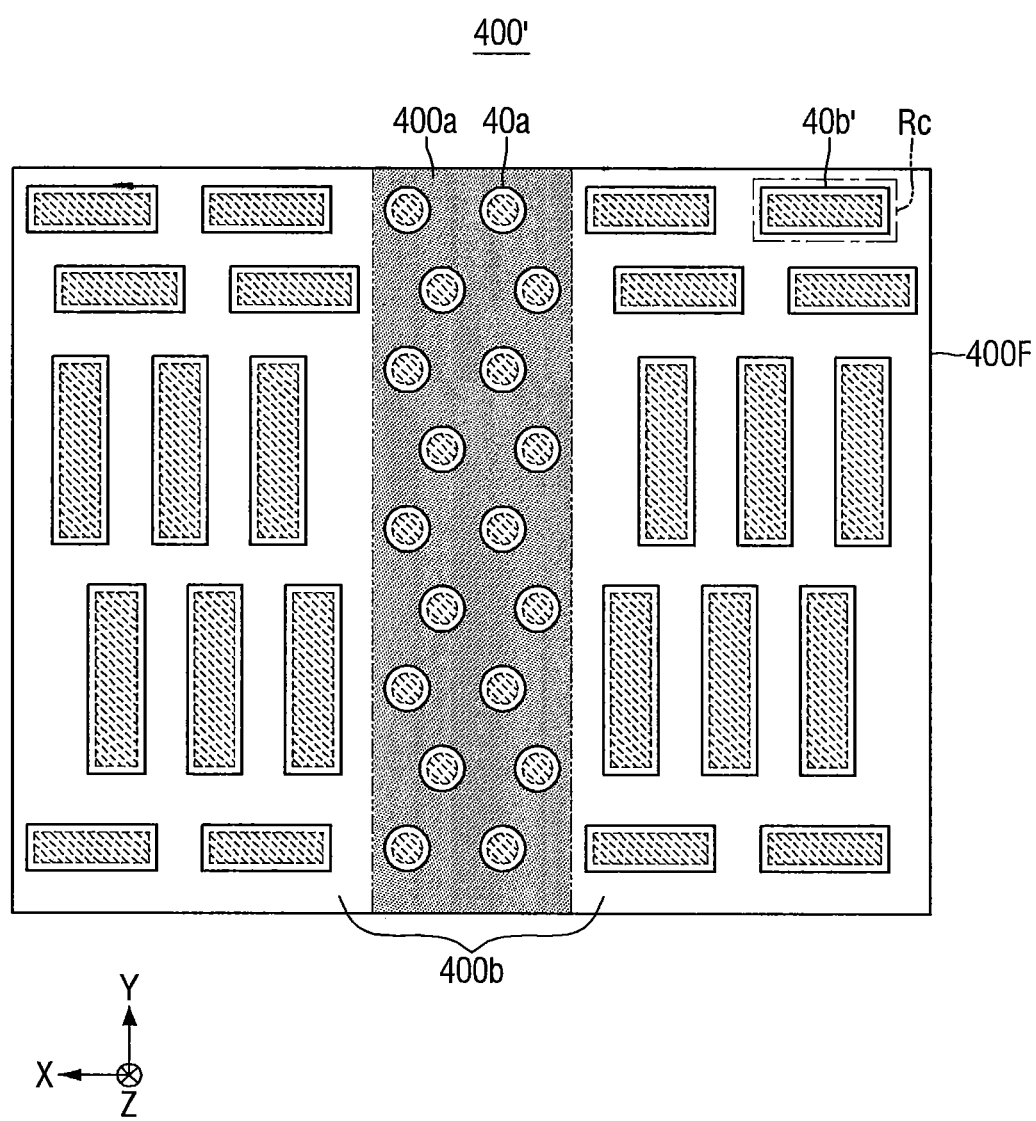
FIG. 18 is a plan view illustrating a semiconductor chip according to some further embodiments of the present disclosure.
Figure 19:
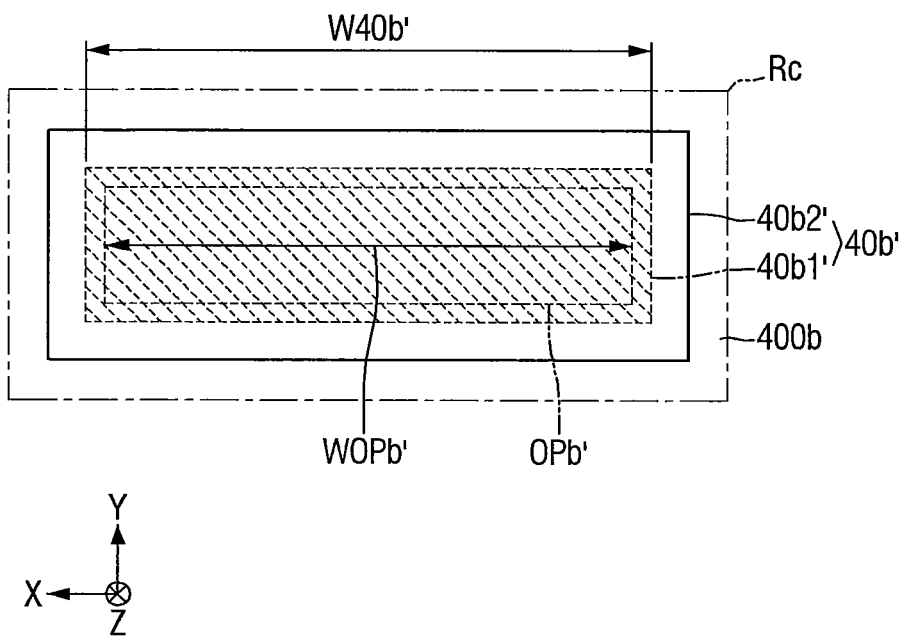
FIG. 19 is an enlarged view of an area "Rc" of FIG. 18.

Referring to FIG. 17, the rear lines 41a and 41b are respectively bonded to second bumps 40a and 40b of another second semiconductor chip 400. In this way, the semiconductor package 1 is formed FIG. 18 and FIG. 19 are diagrams illustrating a semiconductor chip 400' according to some further embodiments of the present disclosure. FIG. 19 is an enlarged view of an area "Rc" of FIG. 18. For convenience of description, the following description will focus on differences from the description referring to FIG. 1 to FIG. 7.

Referring to FIG. 18 and FIG. 19, the second signal bump 40a and the second dummy bump 40b in FIG. 4 correspond to a second signal bump 40a and a second dummy bump 40b' in FIG. 18, respectively.

The second dummy bump 40b' has a rectangular planar shape, and each of the dummy pillar 40b1' and the second opening OPb' also has a rectangular planar shape. When the second topmost line TTMb extends in the first direction X, a second width W4Ob' of the second dummy bump 40b' extending in the first direction X is within a range of 15 μm to 80 μm, and a second opening width WOPb' of the second opening OPb' extending in the first direction X is in a range of 10 μm to 75 μm.

Figure 20:
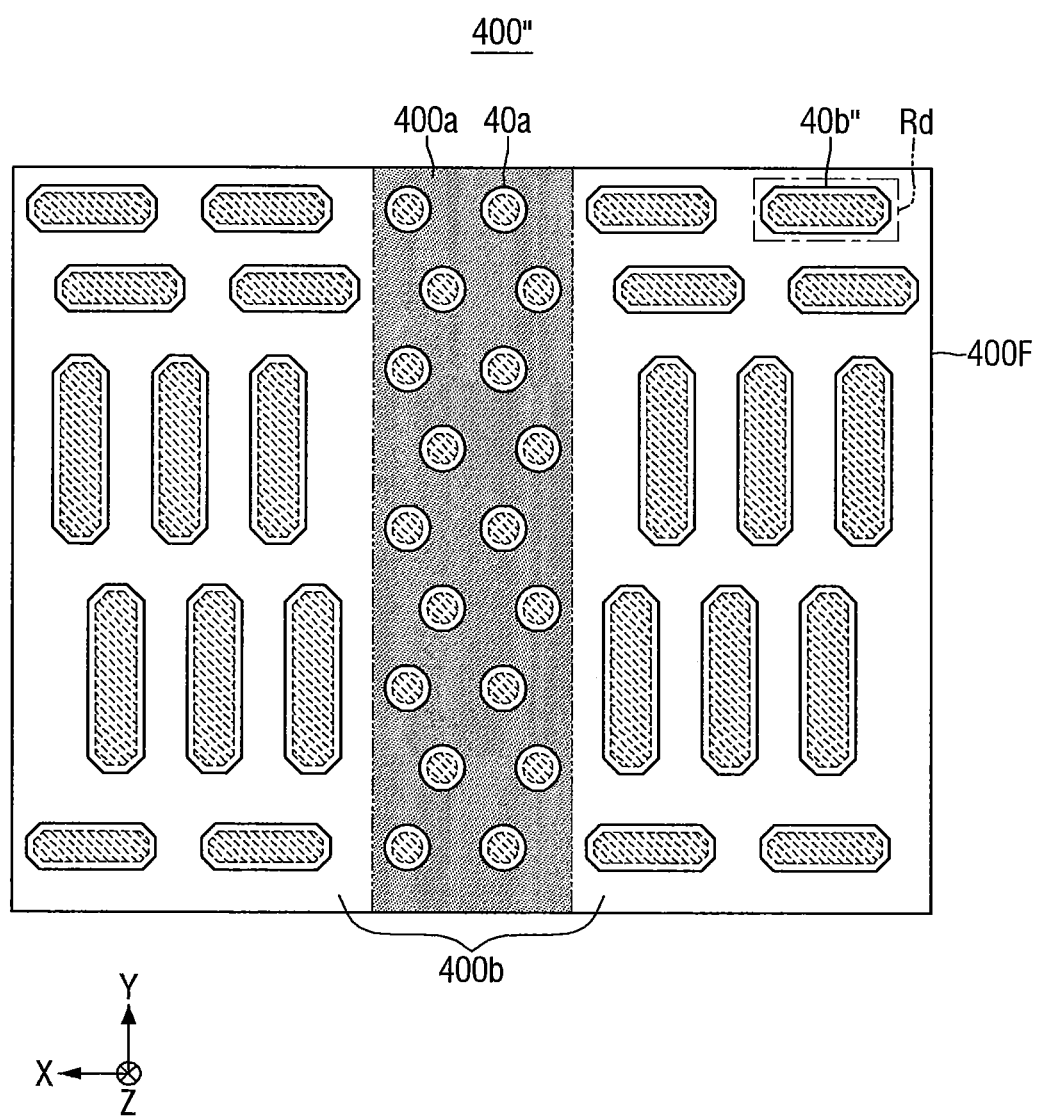
FIG. 20 is a plan view illustrating a semiconductor chip according to some further embodiments of the present disclosure.
Figure 21:
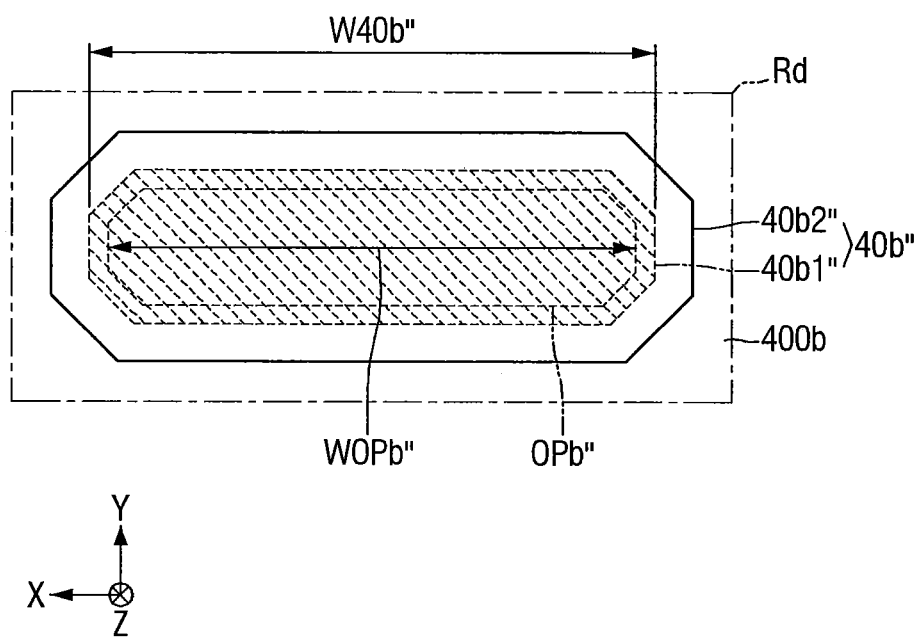
FIG. 21 is an enlarged view of an area "Rd" of FIG. 20.

FIG. 20 and FIG. 21 are diagrams for illustrating a semiconductor chip 400'' according to some further embodiments of the present disclosure. FIG. 21 is an enlarged view of an area "Rd" of FIG. 20. For convenience of description, the following description will focus on differences from the description referring to FIG. 1 to FIG. 7.

Referring to FIG. 20 and FIG. 21, the second signal bump 40a and the second dummy bump 40b in FIG. 4 correspond to the second signal bump 40a and the second dummy bump 40b'' in FIG. 20, respectively.

The second dummy bump 40b'' has an octagonal chamfer or octagonal shape in plan view, and each of the dummy pillar 40b1'' and the second opening OPb'' also has an octagonal planar shape. When the second topmost line TTMb extends in the first direction X, a second width W4Ob'' of the second dummy bump 40b'' extending in the first direction X is in a range of 15 μm to 80 μm, and a second opening width WOPb'' of the second opening OPb'' extending in the first direction X is in a range of 10 μm to 75 μm.

In addition, even when a shape of the second dummy bump is a polygon other than a rectangle/octagon, unlike FIG. 1 to FIG. 21, the technical idea of the present disclosure is equally applied thereto.

Figure 22:
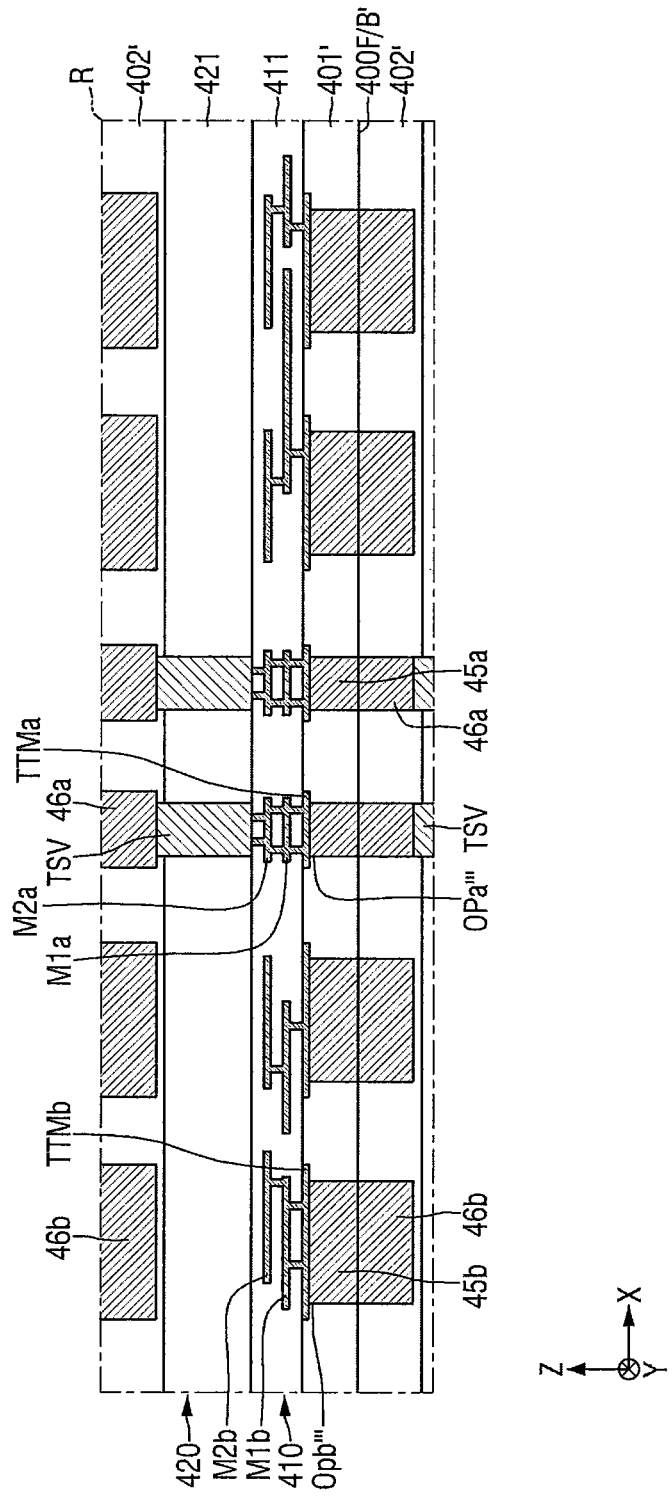
FIG. 22 is a diagram illustrating a semiconductor chip according to some further embodiments of the present disclosure.

FIG. 22 is a diagram illustrating a semiconductor chip according to some further embodiments of the present disclosure. For convenience of description, the following description will focus on differences from the description referring to FIG. 1 to FIG. 7.

The redistribution layer 410, the semiconductor element layer 420, the passivation layer 401, the rear passivation layer 402, the second signal bump 40a, the second dummy bump 40b, the first rear line 41a, and the second rear line 41b in FIG. 3 correspond to a redistribution layer 410, a semiconductor element layer 420, a passivation layer 401', a rear passivation layer 402', a signal bonding metal 45a, a dummy bonding metal 45b, a first rear bonding metal 46a, and a second rear bonding metal 46b in FIG. 22, respectively.

Instead of placing an underfill material into a space between the second semiconductor chips 400, the passivation layer 401' is in direct contact with a rear passivation layer 402' of another second semiconductor chip 400.

The signal bonding metal 45a may be in direct contact with a first rear bonding metal 46a of another second semiconductor chip 400. The dummy bonding metal 45b directly contacts a second rear bonding metal 46b of another second semiconductor chip 400.

For example, when each of the signal bonding metal 45a, the dummy bonding metal 45b, the first rear bonding metal 46a, and the second rear bonding metal 46b is made of copper (Cu), a bonding scheme may be embodied as a Cu—Cu bonding scheme, and the bonding metal may include aluminum or tungsten.

Figure 23:
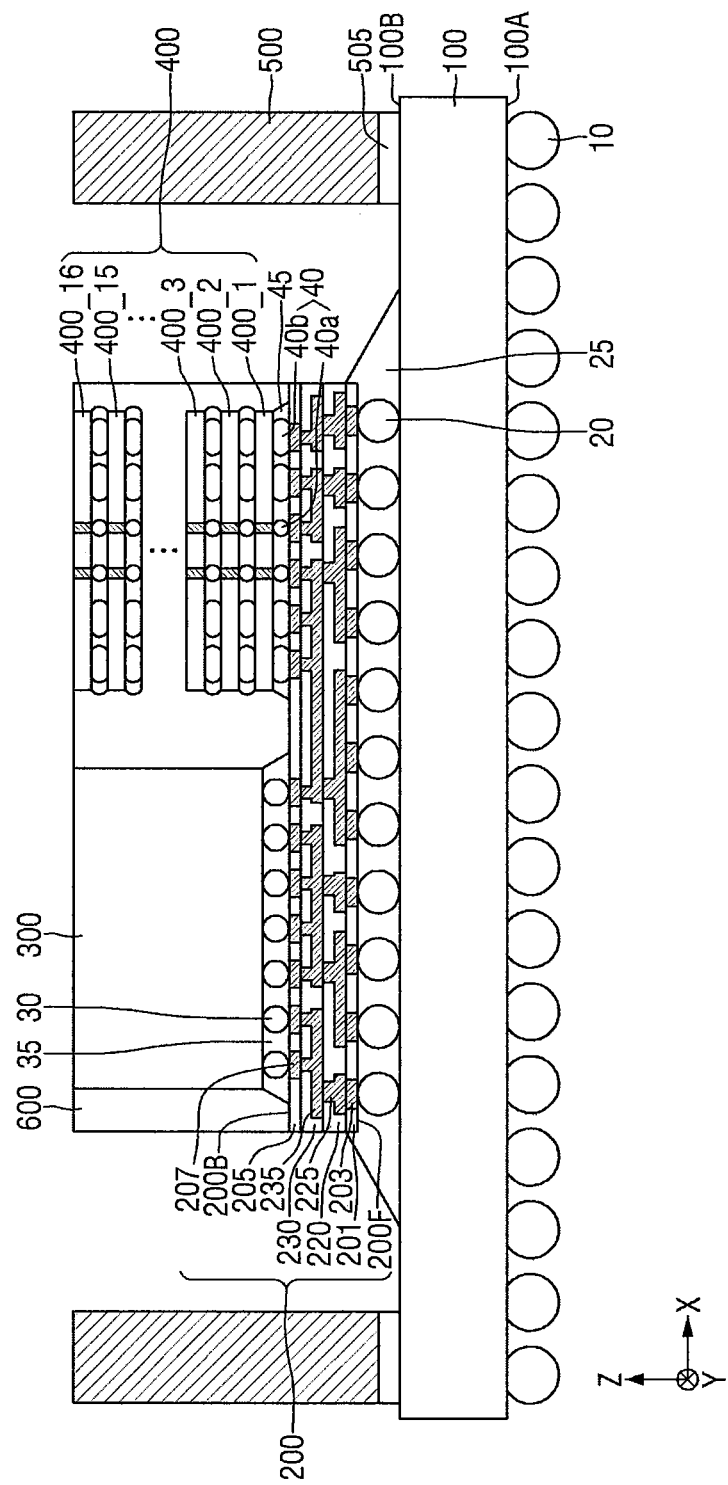
FIG. 23 is a diagram illustrating a semiconductor package according to some further embodiments of the present disclosure.

FIG. 23 is a diagram for illustrating a semiconductor package according to some further embodiments of the present disclosure. For convenience of description, the following description will focus on differences from the description referring to FIG. 2.

Referring to FIG. 23, a semiconductor package according to some further embodiments of the present disclosure may include a substrate 100, an underfill material 25, an internal connection terminal 20, an interposer layer 200, a molding layer 600, a first semiconductor chip 300, and a second semiconductor chip 400. The interposer layer 200 may include a first passivation layer 201, a second passivation layer 205, a first layer 220, and a second layer 230. That is, the first semiconductor chip and the second semiconductor chip 300 and 400 may be connected to the interposer layer 200 via first and second bumps 30 and 40, respectively, and may be electrically connected to the substrate 100 via the internal connection terminal 20 and the first line 225 and the second line 235.

Figure 24:
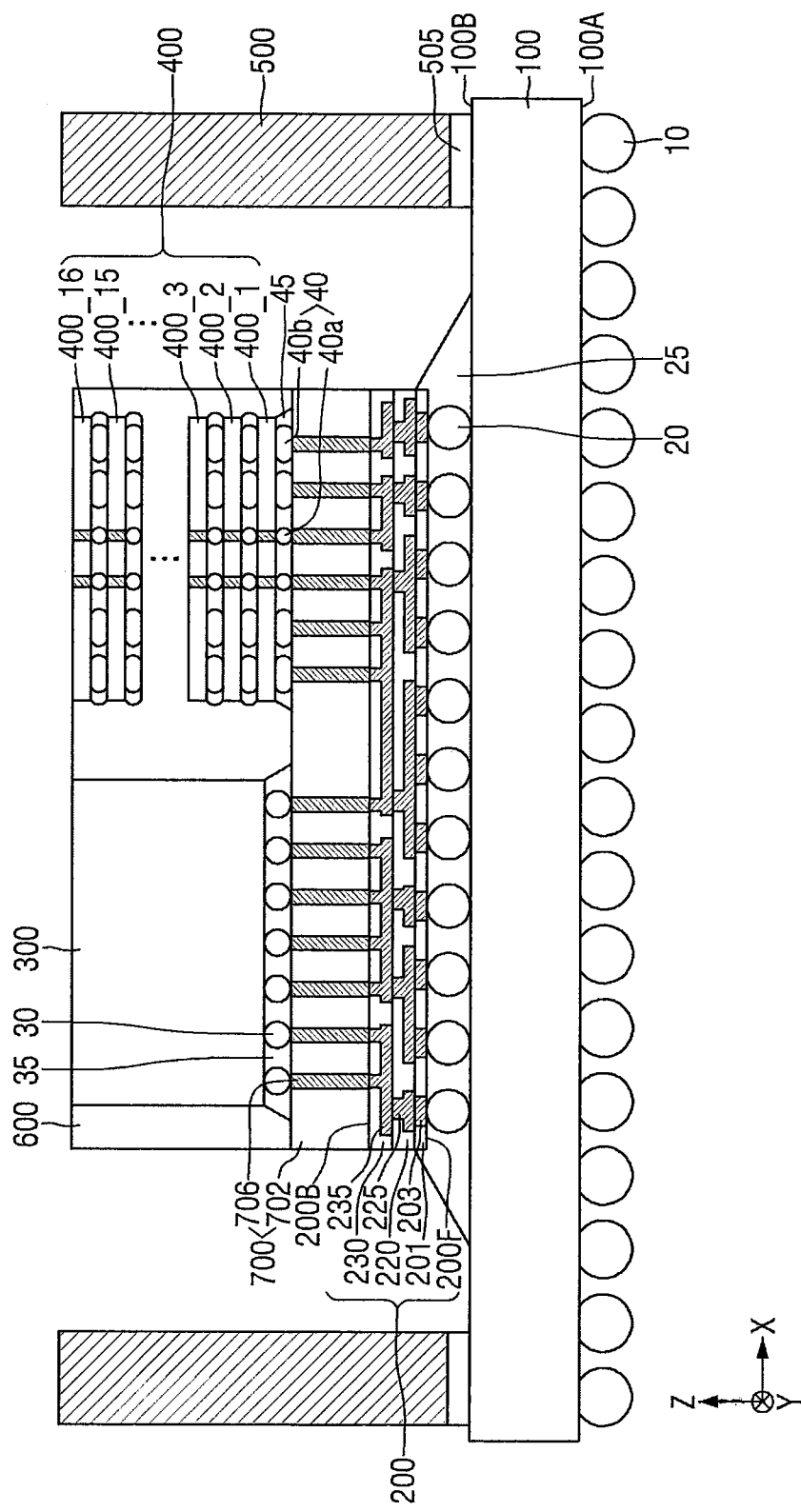
FIG. 24 is a diagram illustrating a semiconductor package according to some further embodiments of the present disclosure.

FIG. 24 is a diagram illustrating a semiconductor package according to some further embodiments of the present disclosure. For convenience of description, the following description will focus on differences from the description referring to FIG. 23.

Referring to FIG. 24, the semiconductor package according to some embodiments of the present disclosure may further include a first chip package 700 disposed on a first line 225 and a second line 235. The first chip package 700 may include a third semiconductor chip 702 and a second through-via 706.

The second through-via 706 may extend through the third semiconductor chip 702. The second through-via 706 may be connected to the first line 225, the second line 235, and first and second bumps 30 and 40. The second through-via 706 may extend through the third semiconductor chip 702 in the third direction Z. The second through-via 706 may act as a conductive through electrode. Therefore, the third semiconductor chip 702 may be electrically connected to the first and second semiconductor chips 300 and 400 via the second through-via 706.

For example, each of the first and second semiconductor chips 300 and 400 may act as a memory chip, while the third semiconductor chip 702 may act as a logic chip. Alternatively, each of the first and second semiconductor chips 300 and 400 may act as a logic chip, while the third semiconductor chip 702 may act as a memory chip.

Although the first chip package 700 is disposed between the first line 225 and the second line 235 and the first and second semiconductor chips 300 and 400 in FIG. 24, the present disclosure is not limited thereto. The first chip package 700 may be disposed between the first line 225, the second line 235 and the internal connection terminal 20. That is, the first line 225 and the second line 235 may be disposed on a top face of the first chip package 700. The first chip package 700 may be connected to the internal connection terminal 20 and the first line 225 and the second line 235 via the second through-via 706.

Figure 25:
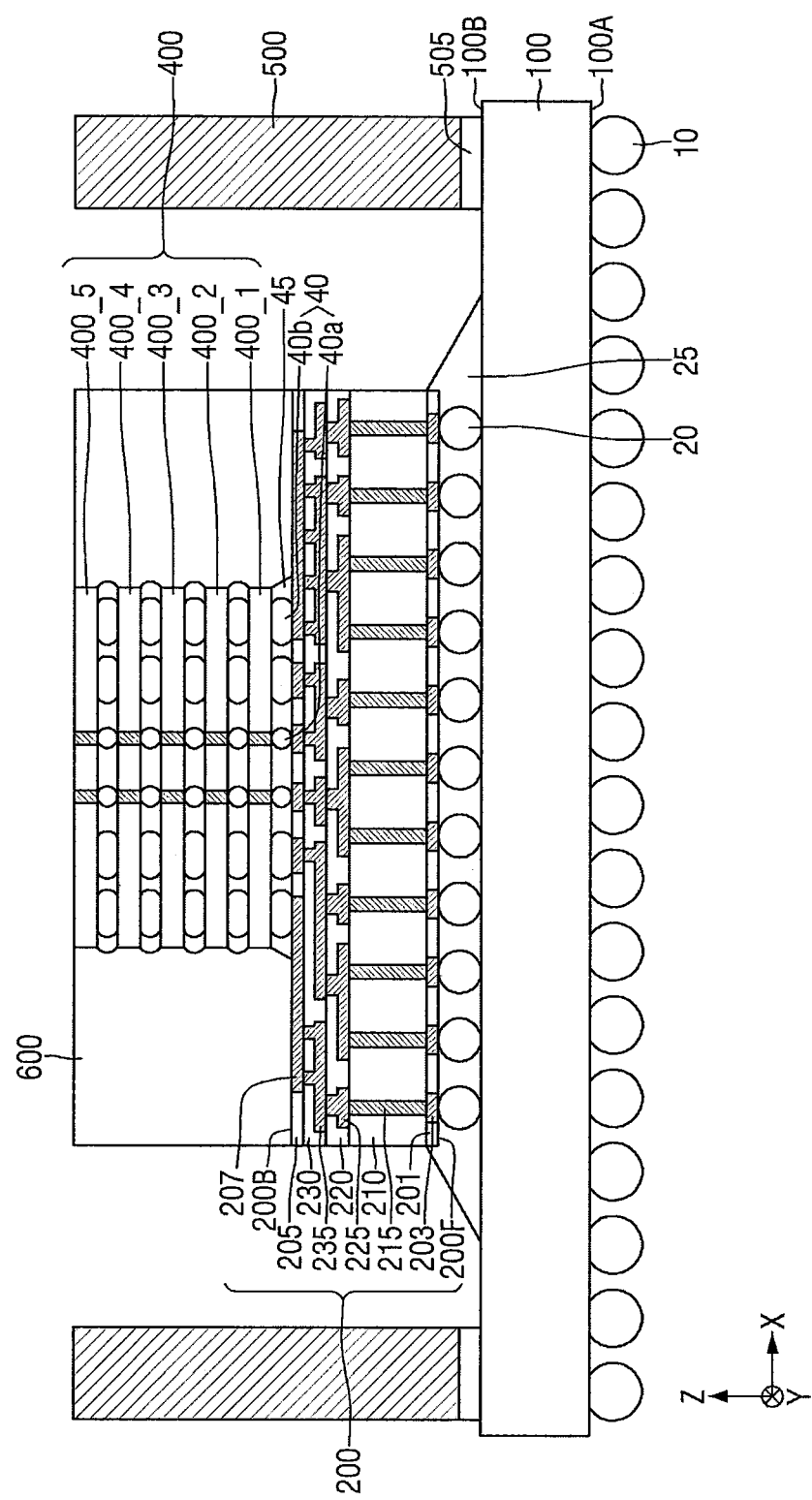
FIG. 25 is a diagram illustrating a semiconductor package according to some further embodiments of the present disclosure.

FIG. 25 is a diagram illustrating a semiconductor package according to some further embodiments of the present disclosure. For convenience of description, the following description will focus on differences from the description referring to FIG. 2.

The second semiconductor chip 400 may be disposed on the interposer layer 200 such that the semiconductor package may have a 3D stack shape. The second semiconductor chip 400 may include second-first to second-fifth semiconductor chips 400_1 to 400_5. The second-first to second-fifth semiconductor chips 400_1 to 400_5 are sequentially stacked on the interposer layer 200.

In one example, each of the second-first to second-third semiconductor chips 400_1 to 400_3 may act as a memory chip, the second-fourth semiconductor chip 400_3 may act as an analog circuit, and the second-fifth semiconductor chip 400_5 may act as a pixel circuit.

Figure 26:
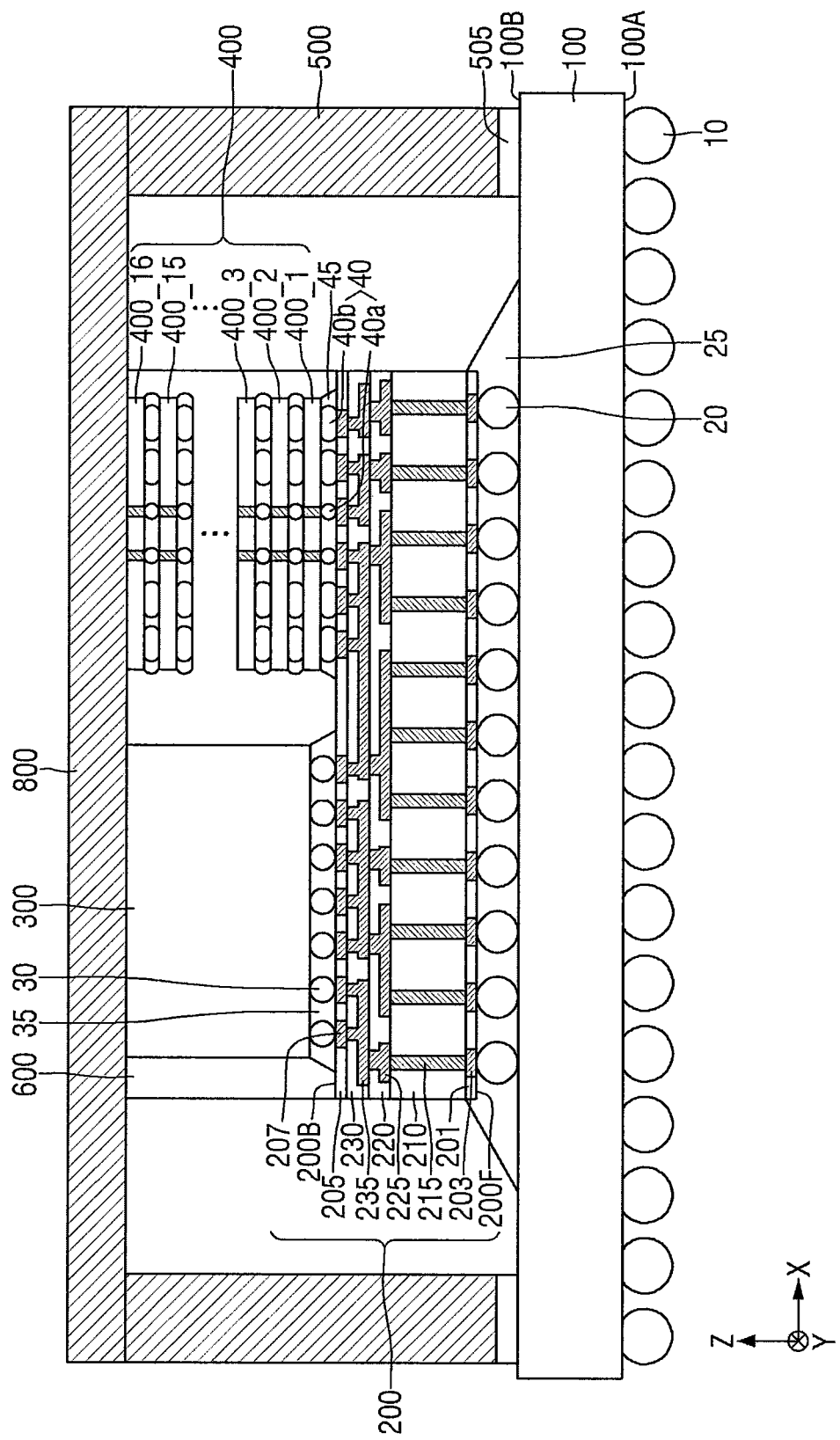
FIG. 26 is a diagram illustrating a semiconductor package according to some further embodiments of the present disclosure.

FIG. 26 is a diagram illustrating a semiconductor package according to some further embodiments of the present disclosure. For convenience of description, the following description will focus on differences from the description referring to FIG. 2.

Referring to FIG. 26, the semiconductor package according to some further embodiments of the present disclosure may further include a heat slug 800. The heat slug 800 may be disposed on the first semiconductor chip 300, the second semiconductor chip 400, and the molding layer 600.

Therefore, heat generated from the semiconductor package may be removed through the heat slug 800.

Although the embodiments of the present disclosure have been described in more detail with reference to the accompanying drawings, the present disclosure is not necessarily limited to these embodiments. The present disclosure may be implemented in various modified manners within the scope of the present disclosure. Therefore, it should be understood that the embodiments as described above are illustrative and non-limiting in all respects. The scope of protection of the present disclosure should be interpreted by the following claims.

What is claimed is:

1. A semiconductor chip comprising:
   a semiconductor element layer including a semiconductor substrate including a bump area and a dummy bump area non-overlapping each other horizontally, wherein a through silicon via (TSV) structure is disposed in the bump area and vertically extends through the semiconductor substrate;
   a first topmost line disposed in the bump area and on the TSV structure, and electrically connected to the TSV structure;
   a signal bump disposed in the bump area, and having a first width in a first direction, and electrically connected to the TSV structure via the first topmost line;
   a second topmost line disposed in the dummy bump area, and having a vertical level that is the same as a vertical level of the first topmost line, and extending in the first direction; and
   a dummy bump disposed in the dummy bump area and contacting the second topmost line, and having a second width in the first direction larger than the first width.

2. The semiconductor chip of claim 1, wherein the semiconductor substrate includes a first face facing toward the first and second topmost lines and a second face opposite to the first face,
   wherein the semiconductor chip further comprises a rear passivation layer covering the second face,
   wherein the TSV structure is exposed through an opening defined in the rear passivation layer.

3. The semiconductor chip of claim 2, wherein the semiconductor chip further comprises:
   a first rear line disposed in the bump area and on the rear passivation layer; and a second rear line disposed in the dummy bump area and having a vertical level that is the same as a vertical level of the first rear line,
wherein the first rear line is in contact with the TSV structure.

4. The semiconductor chip of claim 1, wherein the semiconductor chip further comprises a passivation layer covering at least a portion of each of the first and second topmost lines, wherein the passivation layer is disposed between the first and second topmost lines and the signal bump.

5. The semiconductor chip of claim 4, wherein the passivation layer has first and second openings defined therein respectively exposing a portion of the first topmost line and a portion of the second topmost line,
wherein a first opening width in the first direction of the first opening exposing the portion of the first topmost line is smaller than a second opening width in the first direction of the second opening exposing the portion of the second topmost line.

6. The semiconductor chip of claim 5, wherein the first opening width is in a range of 5 μm to 15 μm, and the second opening width is in a range of 10 μm to 75 μm.

7. The semiconductor chip of claim 1, wherein the first width is in a range of 10 μm to 20 μm, and the second width is in a range of 15 μm to 80 μm.

8. The semiconductor chip of claim 1, wherein the dummy bump has an elliptical planar shape.

9. A semiconductor package comprising:
a package substrate; and
first and second semiconductor chips sequentially stacked on the package substrate,
wherein the first semiconductor chip includes:
a first semiconductor element layer including a first semiconductor substrate including a first bump area and a first dummy bump area that do not overlap one another horizontally, wherein a first TSV structure is disposed in the first bump area and vertically extends through the first semiconductor substrate, wherein the first bump area is electrically connected to a second bump area of the second semiconductor chip via the first TSV structure, wherein the first dummy bump area is vertically aligned with or vertically overlaps a second dummy bump area of the second semiconductor chip;
a first topmost line disposed in the first bump area and on the first TSV structure and electrically connected to the first TSV structure;
a signal bump disposed in the first bump area, and having a first width in a first direction and electrically connected to the first TSV structure via the first topmost line;
a second topmost line disposed in the first dummy bump area, and having a vertical level that is the same as a vertical level of the first topmost line, and extending in the first direction; and
a dummy bump disposed in the first dummy bump area and contacting the second topmost line, and having a second width in the first direction larger than the first width.

10. The semiconductor package of claim 9, wherein the first semiconductor substrate includes a first face facing toward the first and second topmost lines and a second face opposite to the first face,
wherein the first semiconductor chip further includes a rear passivation layer covering the second face,
wherein the TSV structure is exposed through an opening defined in the rear passivation layer.

11. The semiconductor package of claim 10, wherein the first semiconductor substrate further includes:
a first rear line disposed in the bump area and on the rear passivation layer; and
a second rear line disposed in the dummy bump area and having a vertical level that is the same as a vertical level of the first rear line,
wherein the first rear line is in contact with the TSV structure, so that the first bump area is electrically connected to the second bump area via the first TSV structure and the first rear line.

12. The semiconductor package of claim 9, wherein the package further comprises a third semiconductor chip disposed on the package substrate that does not horizontally overlap the first and second semiconductor chips.

13. The semiconductor package of claim 9, wherein the package further comprises an underfill material disposed between the first semiconductor chip and the second semiconductor chip,
wherein a thickness of the underfill material is within a range of 8 μm to 12 μm.

14. The semiconductor package of claim 9, wherein the first width is in a range of 10 μm to 20 μm, and the second width is in a range of 15 μm to 80 μm.

15. The semiconductor package of claim 9, wherein the second semiconductor chip includes a semiconductor memory device, and the first semiconductor chip includes a memory controller.

16. A method for manufacturing a semiconductor package, the method comprising:
providing a semiconductor substrate including a bump area and a dummy bump area that do not overlap horizontally, wherein a TSV structure is disposed in the bump area and vertically extends through the semiconductor substrate;
forming a first topmost line in the bump area and on the TSV structure such that the first topmost line is electrically connected to the TSV structure;
forming a second topmost line in the dummy bump area such that the second topmost line has a vertical level that is the same as a vertical level of the first topmost line and extends in a first direction;
forming a passivation layer to cover the first and second topmost lines;
forming first and second openings in the passivation layer to partially and respectively expose the first and second topmost lines;
forming a signal bump in the first opening such that the signal bump is electrically connected to the TSV structure via the first topmost line and has a first width in the first direction; and
forming a dummy bump in the second opening such that the dummy bump contacts the second topmost line and has a second width in the first direction larger than the first width.

17. The method of claim 16, wherein the method further comprises:
removing a portion of the semiconductor substrate to expose a portion of the TSV structure out of the semiconductor substrate; and
forming a rear passivation layer on the exposed portion of the TSV structure.

18. The method of claim 17, wherein the method further comprises:
performing a planarization process on the rear passivation layer and the TSV structure to expose a portion of the TSV structure out of the rear passivation layer;

forming a first rear line in the bump area such that the first rear line is in contact with the TSV structure; and forming a second rear line in the dummy bump area such that the second rear line has a vertical level that is the same as a vertical level of the first rear line.

19. The method of claim 16, wherein a first opening width in the first direction of the first opening exposing a portion of the first topmost line is smaller than a second opening width in the first direction of the second opening exposing a portion of the second topmost line.

20. The method of claim 19, wherein the first opening width is in a range of 5 μm to 15 μm, and the second opening width is in a range of 10 μm to 75 μm.

* * * * *